United States Patent
Jiang et al.

(10) Patent No.: US 9,543,392 B1
(45) Date of Patent: Jan. 10, 2017

(54) TRANSPARENT GROUP III METAL NITRIDE AND METHOD OF MANUFACTURE

(71) Applicant: SORAA, INC., Fremont, CA (US)

(72) Inventors: Wenkan Jiang, Corona, CA (US); Dirk Ehrentraut, Santa Barbara, CA (US); Mark P. D'Evelyn, Santa Barbara, CA (US)

(73) Assignee: Soraa, Inc., Fremont, CA (US)

( * ) Notice: Subject to any disclaimer, the term of this patent is extended or adjusted under 35 U.S.C. 154(b) by 305 days.

(21) Appl. No.: 14/485,516

(22) Filed: Sep. 12, 2014

Related U.S. Application Data

(63) Continuation-in-part of application No. 14/089,281, filed on Nov. 25, 2013, and a continuation-in-part of application No. 13/894,220, filed on May 14, 2013, now Pat. No. 8,987,156, which is a continuation-in-part of application No. 12/634,665, filed on Dec. 9, 2009, now Pat. No. 8,461,071, (Continued)

(51) Int. Cl.
| | | |
|---|---|---|
| *H01L 33/00* | (2010.01) | |
| *H01L 29/20* | (2006.01) | |
| *C30B 29/40* | (2006.01) | |
| *H01L 29/04* | (2006.01) | |
| *H01L 29/36* | (2006.01) | |
| *H01L 21/02* | (2006.01) | |
| *C30B 7/10* | (2006.01) | |

(52) U.S. Cl.
CPC ......... *H01L 29/2003* (2013.01); *C30B 7/105* (2013.01); *C30B 29/403* (2013.01); *C30B 29/406* (2013.01); *H01L 21/0237* (2013.01); *H01L 21/02458* (2013.01); *H01L 21/02642* (2013.01); *H01L 21/02647* (2013.01); *H01L 29/045* (2013.01); *H01L 29/36* (2013.01); *H01L 33/0075* (2013.01)

(58) Field of Classification Search
None
See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| | (Continued) | |

FOREIGN PATENT DOCUMENTS

| | | |
|---|---|---|
| CN | 101061570 | 10/2007 |
| JP | H06-87691 | 3/1994 |
| | (Continued) | |

OTHER PUBLICATIONS

Aguilar, 'Ohmic n-contacts to Gallium Nitride Light Emitting Diodes', National Nanotechnologhy Infrastructure Network, 2007, pp. 56-81.

(Continued)

*Primary Examiner* — David Sample
*Assistant Examiner* — Donald M Flores, Jr.
(74) *Attorney, Agent, or Firm* — Saul Ewing LLP

(57) ABSTRACT

Large-area, low-cost single crystal transparent gallium-containing nitride crystals useful as substrates for fabricating GaN devices for electronic and/or optoelectronic applications are disclosed. The gallium-containing nitride crystals are formed by controlling impurity concentrations during ammonothermal growth and processing to control the relative concentrations of point defect species.

22 Claims, 10 Drawing Sheets

Related U.S. Application Data application No. 14/485,516, which is a continuation-in-part of application No. 13/041,199, filed on Mar. 4, 2011, now Pat. No. 8,878,230.

(60) Provisional application No. 61/877,875, filed on Sep. 13, 2013, provisional application No. 61/729,975, filed on Nov. 26, 2012, provisional application No. 61/122,332, filed on Dec. 12, 2008, provisional application No. 61/313,112, filed on Mar. 11, 2010.

(56) References Cited

U.S. PATENT DOCUMENTS

| | | |
|---|---|---|
| 3,335,084 A | 8/1967 | Hall |
| 4,030,966 A | 6/1977 | Hornig et al. |
| 4,066,868 A | 1/1978 | Witkin et al. |
| 4,350,560 A | 9/1982 | Helgeland et al. |
| 4,430,051 A | 2/1984 | von Platen |
| 4,870,045 A | 9/1989 | Gasper et al. |
| 5,098,673 A | 3/1992 | Engel et al. |
| 5,169,486 A | 12/1992 | Young et al. |
| 5,474,021 A | 12/1995 | Tsuno et al. |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall |
| 7,009,215 B2 | 3/2006 | D'Evelyn et al. |
| 7,012,279 B2 | 3/2006 | Wierer, Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 * | 7/2006 | D'Evelyn ............. B82Y 10/00 257/103 |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwili ski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,211,833 B2 | 5/2007 | Slater, Jr. et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,381,591 B2 | 6/2008 | Moden |
| 7,420,261 B2 | 9/2008 | Dwilinski et al. |
| 7,470,938 B2 | 12/2008 | Lee et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,180 B2 | 4/2012 | Felker et al. |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,313,964 B2 | 11/2012 | Sharma et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 8,802,471 B1 | 8/2014 | Cich et al. |
| 8,871,024 B2 | 10/2014 | D'Evelyn |
| 8,878,230 B2 | 11/2014 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0155691 A1 | 10/2002 | Lee et al. |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0138732 A1 | 7/2003 | Nagase |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |

(56) References Cited

U.S. PATENT DOCUMENTS

| | | |
|---|---|---|
| 2004/0245535 A1 | 12/2004 | D'Evelyn et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0021582 A1 | 2/2006 | Saito et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255341 A1 | 11/2006 | Pinnington et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0231978 A1 | 10/2007 | Kanamoto et al. |
| 2007/0234946 A1 | 10/2007 | Hashimoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto et al. |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0213593 A1 | 8/2009 | Foley et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D' Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0108081 A1 | 5/2011 | Werthen et al. |
| 2011/0121331 A1 | 5/2011 | Simonian et al. |
| 2011/0124139 A1 | 5/2011 | Chang |
| 2011/0175200 A1 | 7/2011 | Yoshida |
| 2011/0183498 A1 | 7/2011 | D'Evelyn |
| 2011/0186860 A1 | 8/2011 | Enya et al. |
| 2011/0203514 A1 | 8/2011 | Pimputkar et al. |
| 2011/0220912 A1 | 9/2011 | D'Evelyn |
| 2011/0256693 A1 | 10/2011 | D'Evelyn et al. |
| 2011/0260189 A1 | 10/2011 | Kim |
| 2011/0262773 A1 | 10/2011 | Poblenz et al. |
| 2011/0309373 A1 | 12/2011 | Sharma et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0104359 A1 | 5/2012 | Felker et al. |
| 2012/0104412 A1 | 5/2012 | Zhong et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0112987 A1 | 5/2013 | Fu et al. |
| 2013/0119401 A1 | 5/2013 | D'Evelyn et al. |
| 2013/0126902 A1 | 5/2013 | Isozaki et al. |

(56) References Cited

U.S. PATENT DOCUMENTS

| | | |
|---|---|---|
| 2013/0251615 A1 | 9/2013 | D'Evelyn et al. |
| 2013/0323490 A1 | 12/2013 | D'Evelyn et al. |
| 2014/0050244 A1 | 2/2014 | Ohno et al. |
| 2014/0065360 A1 | 3/2014 | D'Evelyn et al. |
| 2014/0147650 A1 | 5/2014 | Jiang et al. |

FOREIGN PATENT DOCUMENTS

| | | |
|---|---|---|
| JP | 10-032348 | 2/1998 |
| JP | 2002-513375 | 5/2002 |
| JP | 2005-289797 | 10/2005 |
| JP | 2005-298269 | 10/2005 |
| JP | 2006-315947 | 11/2006 |
| JP | 2007-039321 | 2/2007 |
| JP | 2008-133151 | 6/2008 |
| JP | 2008-521737 | 6/2008 |
| JP | 2008-222519 | 9/2008 |
| JP | 2009-071287 | 4/2009 |
| JP | 2009-520678 | 5/2009 |
| JP | 2009-527913 | 7/2009 |
| JP | 2009-286652 | 12/2009 |
| JP | 2010-010705 | 1/2010 |
| JP | 2010-047463 | 3/2010 |
| JP | 2012-512119 | 5/2012 |
| WO | WO 2004/030061 | 4/2004 |
| WO | WO 2004/061923 | 7/2004 |
| WO | WO 2005/121415 | 12/2005 |
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2012/016033 | 2/2012 |

OTHER PUBLICATIONS

Altoukhov et al., 'High reflectivity airgap distributed Bragg reflectors realized by wet etching of AlInN sacrificial layers', Applied Physics Letters, vol. 95, 2009, pp. 191102-1-191102-3.

Amano et al., 'Metalorganic Vapor Phase Epitaxial Growth of a High Quality GaN Film Using an AIN Buffer Layer', Applied Physics Letter, vol. 48, No. 5, 1986, pp. 353-355.

Baker et al., 'Characterization of Planar Semipolar Gallium Nitride Films on Spinel Substrates', Japanese Journal of Applied Physics, vol. 44, No. 29, 2005, pp. L920-L922.

Baker et al., 'Characterization of Planar Semipolar Gallium Nitride Films on Sapphire Substrates', Japanese Journal of Applied Physics, vol. 45, No. 6, 2006, pp. L154-L157.

Byrappa et al., 'Handbook of Hydrothermal Technology: A Technology for Crystal Growth and Materials Processing', Noyes Publications, Park Ridge, New Jersey, 2001, pp. 94-96 and 152.

Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.

Cantu et al., 'Si Doping Effect on Strain Reduction in Compressively Strained Al0.49Ga0.51N Thin Films', Applied Physics Letter, vol. 83, No. 4, 2003, pp. 674-676.

Chakraborty et al., 'Defect Reduction in Nonpolar a-Plane GaN Films Using in situ SiNx Nanomask', Applied Physics Letters, vol. 89, 2006, pp. 041903-1-041903-3.

Chiang et al., 'Luminescent Properties of Cerium-Activated Garnet Series Phosphor: Structure and Temperature Effects', Journal of the Electrochemical Society, vol. 155, No. 6, 2008, pp. B517-B520.

Chiu et al., 'Synthesis and Luminescence Properties of Intensely Red-Emitting M5Eu(WO4)4-x(MoO4)x(M=Li, Na, K) Phosphors', Journal of the Electrochemical Society, vol. 155, No. 3, 2008, pp. J71-J78.

Choi et al., '2.51 microcavity InGaN light-emitting diodes fabricated by a selective dry-etch thinning process', Applied Physics Letters, 2007, 91(6), 061120.

Cl et al., 'Ca1-xMo1-ySiyO4:Eux3+: A Novel Red Phosphor for White Light Emitting Diodes', Physica B, vol. 403, 2008, pp. 670-674.

Copel et al., 'Surfactants in Epitaxial Growth', Physical Review Letters, Aug. 7, 1989, vol. 63, No. 6, p. 632-635.

Corrion et al., 'Structural and Morphological Properties of GaN Buffer Layers Grown by Ammonia Molecular Beam Epitaxy on SiC Substrates for AIGaN/GaN High Electron Mobility Transistors', Journal of Applied Physics, vol. 103, No. 9, 2008, pp. 093529-1-093529-7.

Davidsson et al., 'Effect of AIN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.

D'Evelyn et al., 'Bulk GaN Crystal Growth by the High-Pressure Ammonothermal Method', Journal of Crystal Growth, vol. 300, 2007, pp. 11-16.

Dorsaz et al., 'Selective oxidation of AlInN Layers for current confinement III-nitride devices', Applied Physics Letters, vol. 87, 2005, pp. 072102.

Dwilinski et al., 'AMMONO Method of BN, AlN and GaN Synthesis and Crystal Growth', MRS Internet Journal Nitride Semiconductor Research, vol. 3, No. 25, 1998, pp. 1-5.

Dwilinski et al., 'Excellent Crystallinity of Truly Bulk Ammonothermal GaN', Journal of Crystal Growth, vol. 310, 2008, pp. 3911-3916.

Ehrentraut et al., 'The ammonothermal crystal growth of gallium nitride—A technique on the up rise', Proceedings IEEE, 2010, 98(7), pp. 1316-1323.

Fang., 'Deep centers in semi-insulating Fe-doped native GaN substrates grown by hydride vapour phase epitaxy', Physica Status Solidi, vol. 5, No. 6, 2008, pp. 1508-1511.

Farrell et al., 'Continuous-Wave Operation of AIGaN-Cladding-Free Nonpolar m-Plane InGaN/GaN Laser Diodes', 2007, Japanese Journal of Applied Physics, vol. 46, No. 32, 2007, pp. L761-L763.

Feezell et al., 'AIGaN-Cladding-Free Nonpolar InGaN/GaN Laser Diodes', Japanese Journal of Applied Physics, vol. 46, No. 13, 2007, pp. L284-L286.

Frayssinet et al., 'Evidence of Free Carrier Concentration Gradient Along the c-Axis for Undoped GaN Single Crystals', Journal of Crystal Growth, vol. 230, 2001, pp. 442-447.

Fujito et al., 'Development of Bulk GaN Crystals and Nonpolar/Semipolar Substrates by HVPE', MRS Bulletin, May 2009, vol. 34, No. 5, pp. 313-317.

Fukuda et al., 'Prospects for the Ammonothermal Growth of Large GaN Crystal', Journal of Crystal Growth, vol. 305, 2007, pp. 304-310.

Gladkov et al., 'Effect of Fe doping on optical properties of freestanding semi-insulating HVPE GaN:Fe', Journal of Crystal Growth, 312, 2010, pp. 1205-1209.

Grandjean et al., 'Nitridation of Sapphire. Effect on the Optical Properties of GaN Epitaxial Overlayers', Applied Physics Letters, vol. 69, No. 14, 1996, pp. 2071-2073.

Green et al., 'Polarity Control During Molecular Beam Epitaxy Growth of Mg-Doped GaN', Journal of Vacuum Science Technology, vol. B-21, No. 4, 2003, pp. 1804-1811.

Grzegory, 'High pressure growth of bulk GaN from Solutions in gallium', Journal of Physics Condensed Matter, vol. 13, 2001, pp. 6875-6892.

Happek, 'Development of Efficient UV-LED Phosphor Coatings for Energy Saving Solid State Lighting', University of Georgia, 2007, 22 pages.

Hashimoto et al., 'A GaN bulk crystal with improved structural quality grown by the ammonothermal method', Nature Materials, vol. 6, 2007, pp. 568-671.

Hashimoto et al., 'Ammonothermal Growth of Bulk GaN', Journal of Crystal Growth, vol. 310, 2008, pp. 3907-3910.

Hellman, 'The Polarity of GaN: A Critical Review', MRS Internet Journal Nitride Semiconductor Research, vol. 3, No. 11, 1998, pp. 1-11.

Heying et al., 'Control of GaN Surface Morphologies Using Plasma-Assisted Molecular Beam Epitaxy', Journal of Applied Physics, vol. 88, No. 4, 2000, pp. 1855-1860.

(56) References Cited

OTHER PUBLICATIONS

Hoppe et al., 'Luminescence in Eu2+-Doped Ba2Si5N8: Fluorescence, Thermoliminescence, and Upconversion', Journal of Physics and Chemistry of Solids, vol. 61, 2000, pp. 2001-2006.

Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.

Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.

Keller et al., 'Influence of Sapphire Nitridation on Properties of Gallium Nitride Grown by Metalorganic Chemical Vapor Deposition', Applied Physics Letters, vol. 68, No. 11, 1996, pp. 1525-1527.

Keller et al., 'Influence of the Substrate Misorientation on the Properties of N-Polar GaN Films Grown by Metal Organic Chemical Vapor Deposition', Journal of Applied Physics, vol. 102, 2007, pp. 083546-1-083546-6.

Kim et al., 'Improved Electroluminescence on Nonpolar m-Plane InGaN/GaN Qantum Well LEDs', Rapid Research Letters, vol. 1, No. 3, 2007, pp. 125-127.

Koblmuller et al., 'In Situ Investigation of Growth Modes During Plasma-Assisted Molecular Beam Epitaxy of (0001) GaN', Applied Physics Letters, vol. 91, 2007, pp. 161904-1-161904-3.

Koblmuller et al., 'High Electron Mobility GaN Grown Under N-Rich Conditions by Plasma-Assisted Molecular Beam Epitaxy', Applied Physics Letters, vol. 91, 2007, pp. 221905-1-221905-3.

Kojima et al., 'Stimulated Emission at 474 nm From an InGaN Laser Diode Structure Grown on a (1122) GaN Substrate', Applied Physics Letters, vol. 91, 2007, pp. 251107-251107-3.

Kolis et al., 'Materials Chemistry and Bulk Crystal Growth of Group III Nitrides in Supercritical Ammonia', Material Resources Society Symposium Proceedings, vol. 495, 1998, pp. 367-372.

Kolis et al., 'Crystal Growth of Gallium Nitride in Supercritical Ammonia', Journal of Crystal Growth, vol. 222, 2001, pp. 431-434.

Kubota et al., 'Temperature Dependence of Polarized Photoluminescence From Nonpolar m-Plane InGaN Multiple Quantum Wells for Blue Laser Diodes', Applied Physics Letter, vol. 92, 2008, pp. 011920-1-011920-3.

Li et al., 'The Effect of Replacement of Sr by Ca OnThe Structural and Luminescence Properties of the Red-Emitting Sr2Si5N8:Eu2+ LED Conversion Phosphor', Journal of Solid State Chemistry, vol. 181, 2008, pp. 515-524.

Lide et al., 'Thermal Conductivity of Ceramics and Other Insulating Materials', CRC Handbook of Chemistry and Physics, 91st Edition, 2010-2011, pp. 12-203 and 12-204.

Lu et al., 'Structure of the Cl-passivated GaAs(111) surface', Physical Review B, Nov. 15, 1998, vol. 58, No. 20, pp. 13820-13823.

Lu et al., 'Etch-Pits of GaN Films with Different Etching Methods', Journal of the Korean Physical Society, vol. 45, Dec. 2004, S673-S675.

Manfra et al., 'Dislocation and Morphology Control During Molecular-Beam Epitaxy of AIGaN/GaN Heterostructures Directly on Sapphire Substrates', Applied Physics Letters, vol. 81, No. 8, 2002, pp. 1456-1458.

Marchand et al., 'Microscructure of GaN Laterally Overgrown by Metalorganic Chemical Vapor Deposition', Applied Physics Letters, vol. 73, No. 6, 1998, pp. 747-749.

Massies et al., 'Surfactant mediated epitaxial growth of InxGa1-xAs on GaAs (001)', Applied Physics Letters, vol. 61, No. 1, Jul. 6, 1992, pp. 99-101.

http://www.matbase.com/material/non-ferrous-metals/other/molybdenum/properties, Data Table for: Non-Ferrous Metals: Other Metals: Molybdenum, Mar. 28, 2011, pp. 1.

Mirwald et al., 'Low-Friction Cell for Piston-Cylinder High Pressure Apparatus', Journal of Geophysical Research, vol. 80, No. 11, 1975, pp. 1519-1525.

Motoki et al., 'Growth and Characterization of Freestanding GaN Substrates', Journal of Crystal Growth, vol. 237-239, 2002, pp. 912-921.

Moutanabbir, 'Bulk GaN Ion Cleaving', Journal of Electronic Materials, vol. 39, 2010, pp. 482-488.

Mueller-Mach et al., 'Highly Efficient All-Nitride Phosphor-Converted White Light Emitting Diode', Physica Status Solidi (a), vol. 202, 2005, pp. 1727-1732.

Murota et al., 'Solid State Light Source Fabricated With YAG:Ce Single Crystal', Japanese Journal of Applied Physics, vol. 41, Part 2, No. 8A, 2002, pp. L887-L888.

Nakamura et al., 'GaN Growth Using GaN Buffer Layer', Japanese Journal of Applied Physics, vol. 30, No. 10A, 1991, pp. L1705-L1707.

Okamoto et al., 'Continuous-Wave Operation of m-Plane InGaN Multiple Quantum Well Laser Diodes', Japanese Journal of Applied Physics, vol. 46, No. 9, 2007, pp. L187-L189.

Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.

Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.

Pattison et al., 'Gallium Nitride Based Microcavity Light Emitting Diodes With 2? Effective Cavity Thickness', Applied Physics Letters, vol. 90, Issue 3, 031111 (2007) 3pg.

International Search Report of PCT Application No. PCT/US2009/048489, dated Sep. 14, 2009, 12 pages total.

International Search Report & Written Opinion of PCT Application No. PCT/US2009/046252, dated Jul. 29, 2009, 12 pages total.

International Search Report of PCT Application No. PCT/US2009/049725, dated Sep. 1, 2009, 17 pages total.

International Search Report & Written Opinion of PCT Application No. PCT/US2009/054952, dated Oct. 21, 2009, 15 pages total.

International Search Report & Written Opinion of PCT Application No. PCT/US2009/056546, dated Nov. 2, 2009, 13 pages total.

International Search Report & Written Opinion of PCT Application No. PCT/US2009/067745, dated Feb. 5, 2010, 9 pages total.

International Search Report & Written Opinion of PCT Application No. PCT/US2010/052175, dated Jan. 6, 2011, 3 total pages.

Peters, 'Ammonothermal Synthesis of Aluminium Nitride', Journal of Crystal Growth, vol. 104, 1990, pp. 411-418.

Porowski, 'High Resistivity GaN Single Crystalline Substrates', Acta Physica Polonica A, vol. 92, No. 2, 1997, pp. 958-962.

Porowski, 'Near Defect Free GaN Substrates', Journal of Nitride Semiconductor, 1999, pp. 1-11.

Rickert et al., 'n-GaN Surface Treatments for Metal Contacts Studied Via X-ray Photoemission Spectroscopy', Applied Physics Letters, vol. 80, No. 2, Jan. 14, 2002, 204-206.

Roder et al., 'Temperature dependence of the thermal expansion of GaN', Physics Review B, vol. 72., No. 085218, Aug. 24, 2005, 085218-1-085218-6.

Romanov et al., 'Stress Relaxation in Mismatched Layers Due to Threading Dislocation Inclination', Applied Physics Letter, vol. 83, No. 13, 2003, pp. 2569-2571.

Sarva et al., 'Dynamic Compressive Strength of Silicon Carbide Under Uniaxial Compression', Material Sciences and Engineering, vol. A317, 2001, pp. 140-144.

Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.

Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.

Schmidt et al., 'Demonstration of Nonpolar m-Plane InGaN/GaN Laser Diodes', Japanese Journal of Applied Physics, vol. 46, No. 9, 2007, pp. L190-L191.

Selvanathan et al., 'Investigation of Surface Treatment Schemes on n-type GaN and Al 0.20Ga0.80N', Journal of Vacuum Science and Technology B, vol. 23, No. 6, May 10, 2005, 2538-2544.

(56) References Cited

OTHER PUBLICATIONS

Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Setlur et al., 'Crystal Chemistry and Luminescence of Ce3+-Doped (Lu2CaMg2(Si,Ge)3O12 and Its Use in LED Based Lighting', Chemistry of Materials, vol. 18, 2006, pp. 3314-3322.
Sharma et al., Applied Physics Letters, vol. 87, 2005, pp. 051107.
Sizov et al., '500-nm Optical Gain Anisotropy of Semipolar (1122) InGaN Quantum Wells', Applied Physics Express, vol. 2, 2009, pp. 071001-1-071001-3.
Stutzmann et al., 'Playing With Polarity', Physics Status Solidi, vol. 228, No. 2, 2001, pp. 505-512.
Sumiya et al., 'High-pressure synthesis of high-purity diamond crystal', Diamond and Related Materials, 1996, vol. 5, pp. 1359-1365.
Sumiya et al., 'Growth Mode and Surface Morphology of a GaN Film Deposited Along the N-Face Polar Direction on c-Plane Sapphire Substrate', Journal of Applied Physics, vol. 88, No. 2, 2000, pp. 1158-1165.
Sumiya et al., 'Review of Polarity Determination and Control of GaN', MRS Internet Journal Nitride Semiconductor Research, vol. 9, No. 1, 2004, pp. 1-34.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Polish Patent Office re P394857 dated Jan. 22, 2013, (2 pages).
Communication from the Chinese Patent Office re 200980154756.9 dated Jun. 17, 2014 (10 pages).
Communication from the Japanese Patent Office re 2011-053647 dated Sep. 17, 2014 (8 pages).
Communication from the Chinese Patent Office re 200980134876.2 dated Jul. 3, 2013, (14 pages).
Communication from the Polish Patent Office re P394857 dated Aug. 14, 2013, (2 pages).
Waltereit et al., 'Structural Properties of GaN Buffer Layers on 4H-SiC(0001) Grown by Plasma-Assisted Molecular Beam Epitaxy for High Electron Mobilty Transistors', Japanese Journal of Applied Physics, vol. 43, No. 12-A, 2004, pp. L1520-L1523.
Wang et al., 'Ammonothermal Growth of GaN Crystals in Alkaline Solutions', Journal of Crystal Growth, vol. 287, 2006, pp. 376-380.
Wang et al., 'Ammonothermal Synthesis of III-Nitride Crystals', Crystal Growth & Design, vol. 6, No. 6, 2006, pp. 1227-1246.
Wang et al., 'Synthesis of Dense Polycrystaline GaN of High Purity by the Chemical Vapor Reaction Process', Journal of Crystal Growth, vol. 286, 2006, pp. 50-54.
Wang et al., 'New Red Y0.85Bi0.1Eu0.05V1-yMyO4 (M=Nb, P) Phosphors for Light-Emitting Diodes', Physica B, vol. 403, 2008, pp. 2071-2075.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, 2004, p. 1-19.
Weyher et al., 'Morphological and Structural Characteristics of Homoepitaxial GaN Grown by Metalorganic Chemical Vapour Deposition (MOCVD)', Journal of Crystal Growth, vol. 204, 1999, pp. 419-428.
Xu et al., 'Polarity Control of GaN Grown on Sapphire Substrate by RF-MBE', Journal of Crystal Growth, vol. 237-239, Pt. 2, 2002, pp. 1003-1007.
Yamamoto, 'White LED Phosphors: The Next Step', Proceeding of SPIE, 2010, pp. 1-10.
Yang et al., 'Preparation and luminescence properties of LED conversion novel phosphors SrZnO2:Sm', Materials Letters, vol. 62, 2008, pp. 907-910.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/133,365 dated May 13, 2013 (22 pages).
USPTO Office Action for U.S. Appl. No. 12/133,365 dated Aug. 21, 2013 (28 pages).
USPTO Office Action for U.S. Appl. No. 12/133,365 dated Feb. 20, 2014 (32 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/334,418 dated Sep. 17, 2013 (26 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/484,095 dated Aug. 29, 2014 (10 pages).
USPTO Office Action for U.S. Appl. No. 12/491,176 dated Mar. 1, 2012 (9 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).
USPTO Office Action for U.S. Appl. No. 12/497,969 dated May 16, 2013 (21 pages).
USPTO Office Action for U.S. Appl. No. 12/497,969 dated Sep. 6, 2013 (20 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/534,843 dated Sep. 10, 2012 (9 pages).
USPTO Notice of Allowance for U.S. Appl. No. 12/534,843 dated Jan. 24, 2013 (8 pages).
USPTO Office Action for U.S. Appl. No. 12/534,844 dated Sep. 16, 2010 (8 pages).

(56) References Cited

OTHER PUBLICATIONS

USPTO Office Action for U.S. Appl. No. 12/534,844 dated Feb. 4, 2011 (9 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,841 dated Dec. 23, 2011 (12 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/636,683 dated Aug. 16, 2013 (16 pages).
USPTO Office Action for U.S. Appl. No. 12/636,683 dated Feb. 24, 2014 (16 pages).
USPTO Office Action for U.S. Appl. No. 12/636,683 dated Nov. 17, 2014 (16 pages).
USPTO Office Action for U.S. Appl. No. 12/697,171 dated Jun. 20, 2013 (16 pages).
USPTO Office Action for U.S. Appl. No. 12/697,171 dated Aug. 20, 2013 (17 pages).
USPTO Office Action for U.S. Appl. No. 12/724,983 dated Mar. 5, 2012 (20 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 12/988,772 dated Dec. 5, 2014 (10 pages).
USPTO Office Action for U.S. Appl. No. 13/013,697 dated Jun. 9, 2014 (5 pages).
USPTO Notice of Allowance for U.S. Appl. No. 13/013,697 dated Aug. 27, 2014 (5 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/041,199 dated Apr. 29, 2014 (12 pages).
USPTO Notice of Allowance for U.S. Appl. No. 13/041,199 dated Sep. 9, 2014 (9 pages).
USPTO Office Action for U.S. Appl. No. 13/160,307 dated Jun. 26, 2014 (19 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/272,981 dated Aug. 15, 2013 (13 pages).
USPTO Notice of Allowance for U.S. Appl. No. 13/272,981 dated Mar. 13, 2014 (10 pages).
USPTO Office Action for U.S. Appl. No. 13/343,563 dated Oct. 8, 2014 (5 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).
USPTO Notice of Allowance for U.S. Appl. No. 13/425,304 dated Aug. 22, 2012 (7 pages).
USPTO Office Action for U.S. Appl. No. 13/472,356 dated Dec. 9, 2013 (11 pages).
USPTO Office Action for U.S. Appl. No. 13/538,426 dated Nov. 21, 2014 (15 pages).
USPTO Notice of Allowance for U.S. Appl. No. 13/548,931 dated Jun. 3, 2013 (10 pages).
USPTO Office Action for U.S. Appl. No. 13/723,968 dated Nov. 29, 2013 (23 pages).
USPTO Notice of Allowance for U.S. Appl. No. 13/723,968 dated Apr. 28, 2014 (8 pages).
USPTO Office Action for U.S. Appl. No. 13/894,220 dated Jul. 31, 2014 (9 pages).
USPTO Notice of Allowance for U.S. Appl. No. 13/894,220 dated Dec. 9, 2014 (8 pages).
Communication from the Japanese Patent Office re 2011-134782 dated Dec. 26, 2014 (9 pages).
USPTO Notice of Allowance for U.S. Appl. No. 13/343,563 dated Dec. 17, 2014 (7 pages).
USPTO Office Action for U.S. Appl. No. 13/538,426 dated Mar. 19, 2015 (16 pages).
USPTO Office Action for U.S. Appl. No. 13/556,105 dated Mar. 13, 2015 (6 pages).

* cited by examiner

TRANSPARENT GROUP III METAL NITRIDE AND METHOD OF MANUFACTURE

This application claims benefit under 35 U.S.C. §119(e) to U.S. Provisional Application No. 61/877,875, filed on Sep. 13, 2013; and this application is a continuation-in-part of U.S. application Ser. No. 14/089,281, filed on Nov. 25, 2013, which claims benefit under 35 U.S.C. §119(e) to U.S. Provisional Application No. 61/729,975, filed on Nov. 26, 2012; and this application is a continuation-in-part of U.S. application Ser. No. 13/894,220 filed on May 14, 2013, which is a continuation-in-part of U.S. application Ser. No. 12/634,665 filed on Dec. 9, 2009, which claims benefit under 35 U.S.C. §119(e) to U.S. Provisional Application No. 61/122,332, filed on Dec. 12, 2008; and this application is a continuation-in-part of U.S. application Ser. No. 13/041,199 filed on Mar. 4, 2011, which claims benefit under 35 U.S.C. §119(e) to U.S. Provisional Application No. 61/313,112, filed on Mar. 11, 2010; each of which is incorporated by reference in its entirety.

GOVERNMENT LICENSE RIGHTS

This invention was made with partial government support under Grant IIP-1026896, awarded by the U.S. National Science Foundation, and Cooperative Agreement DE-AR0000020, awarded by the U.S. Advanced Research Projects Agency-Energy. The government has certain rights in the invention.

FIELD

This disclosure relates to large-area, low-cost single crystal transparent gallium-containing nitride crystals useful as substrates for fabricating GaN devices for electronic and/or optoelectronic applications. The gallium-containing nitride crystals are formed by controlling impurity concentrations during ammonothermal growth and processing to control the types and relative concentrations of point defect species.

BACKGROUND

The present invention generally relates to processing of materials for growth of crystals. More particularly, the present invention provides a transparent gallium-containing nitride crystal synthesized by an ammonobasic or ammonoacidic technique. The present invention provides methods suitable for synthesis of polycrystalline nitride materials, as well as other crystals and materials. Such crystals and materials include, but are not limited to, GaN, AlN, InN, InGaN, AlGaN, and AlInGaN, and for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors.

Gallium nitride containing crystalline materials serve as substrates for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Reasonably high quality, substantially transparent substrates comprising bulk gallium nitride are available commercially, however, in most cases, these substrates are synthesized by hydride vapor phase epitaxy (HVPE), which is relatively expensive.

What is needed is a method for low-cost manufacturing of transparent nitride materials that are transparent, colorless, and of high crystallographic quality.

SUMMARY

In a first aspect, a gallium-containing nitride crystals are disclosed, comprising: a top surface having a crystallographic orientation within about 5 degrees of a plane selected from a (0001)+c-plane and a (000-1)–c-plane; a substantially wurtzite structure; n-type electronic properties; an impurity concentration greater than about $2\times10^{17}$ cm$^{-3}$ of hydrogen; an impurity concentration less than about $1\times10^{17}$ cm$^{-3}$ of oxygen; an H/O ratio of at least 10; an impurity concentration greater than about $2\times10^{14}$ cm$^{-3}$ of at least one of Li, Na, K, Rb, Cs, Ca, F, and Cl; an optical absorption coefficient less than about 5 cm$^{-1}$ at a wavelength of 400 nanometers; an optical absorption coefficient less than about 4 cm$^{-1}$ at a wavelength of 410 nanometers; an optical absorption coefficient less than about 3 cm$^{-1}$ at a wavelength of 415 nanometers; and an optical absorption coefficient less than about 2 cm$^{-1}$ at a wavelength of 450 nanometers; wherein the gallium-containing nitride crystal is characterized by, an absorbance per unit thickness of at least 0.01 cm$^{-1}$ at wavenumbers of 3218 cm$^{-1}$, 3202 cm$^{-1}$, and 3188 cm$^{-1}$; and no infrared absorption peaks at wavenumbers between about 3175 cm$^{-1}$ and about 3000 cm$^{-1}$ having an absorbance per unit thickness greater than 10% of the absorbance per unit thickness at 3218 cm$^{-1}$.

In a second aspect, gallium-containing nitride crystals are provided, comprising: a top surface having a crystallographic orientation within about 5 degrees of a plane selected from a (0001)+c-plane and a (000-1)–c-plane; a substantially wurtzite structure; n-type electronic properties; an impurity concentration greater than about $5\times10^{17}$ cm$^{-3}$ of hydrogen; an impurity concentration between about $2\times10^{17}$ cm$^{-3}$ and about $4\times10^{18}$ cm$^{-3}$ of oxygen; an H/O ratio of at least 0.3; an impurity concentration greater than about $1\times10^{16}$ cm$^{-3}$ of at least one of Li, Na, K, Rb, Cs, Ca, F, and Cl; an optical absorption coefficient less than about 8 cm$^{-1}$ at a wavelength of 400 nanometers; an optical absorption coefficient less than about 6 cm$^{-1}$ at a wavelength of 410 nanometers; an optical absorption coefficient less than about 5.5 cm$^{-1}$ at a wavelength of 415 nanometers; an optical absorption coefficient less than about 4 cm$^{-1}$ at a wavelength of 450 nanometers; an absorbance per unit thickness of at least 0.01 cm$^{-1}$ at wavenumbers of approximately 3175 cm$^{-1}$, 3164 cm$^{-1}$, and 3150 cm$^{-1}$; no infrared absorption peaks at wavenumbers between about 3200 cm$^{-1}$ and about 3400 cm$^{-1}$ or between about 3075 cm$^{-1}$ and about 3125 cm$^{-1}$ having an absorbance per unit thickness greater than 10% of the absorbance per unit thickness at 3175 cm$^{-1}$.

In a third aspect, gallium-containing nitride crystals are provided, comprising: a top surface having a crystallographic orientation within about 5 degrees of a {1 0-1 0} m-plane; a substantially wurtzite structure; n-type electronic properties; an impurity concentration greater than about $3\times10^{18}$ cm$^{-3}$ of hydrogen; an impurity concentration between about $5\times10^{17}$ cm$^{-3}$ and about $3\times10^{19}$ cm$^{-3}$ of oxygen; an H/O ratio of at least 1.1; an impurity concentration greater than about $1 \times 10^{16}$ cm$^{-3}$ of at least one of Li, Na, K, Rb, Cs, Ca, F, and Cl; an optical absorption coefficient less than about 8 cm$^{-1}$ at a wavelength of 400 nanometers; an optical absorption coefficient less than about 6 cm$^{-1}$ at a wavelength of 410 nanometers; an optical absorption coefficient less than about 5.5 cm$^{-1}$ at a wavelength of 415 nanometers; an optical absorption coefficient less than about 4 cm$^{-1}$ at a wavelength of 450 nanometers; an absorbance per unit thickness of at least 0.01 cm$^{-1}$ at 3188 cm$^{-1}$, 3175 cm$^{-1}$, 3164 cm$^{-1}$, and 3150 cm$^{-1}$; and no infrared absorption peaks at wavenumbers between about 3125 cm$^{-1}$ and about 3000 cm$^{-1}$, having an absorbance per unit thickness greater than 10% of the absorbance per unit thickness at 3188 cm$^{-1}$.

BRIEF DESCRIPTION OF THE DRAWINGS

Those skilled in the art will understand that the drawings, described herein, are for illustration purposes only. The drawings are not intended to limit the scope of the present disclosure.

DETAILED DESCRIPTION

Figure 1:
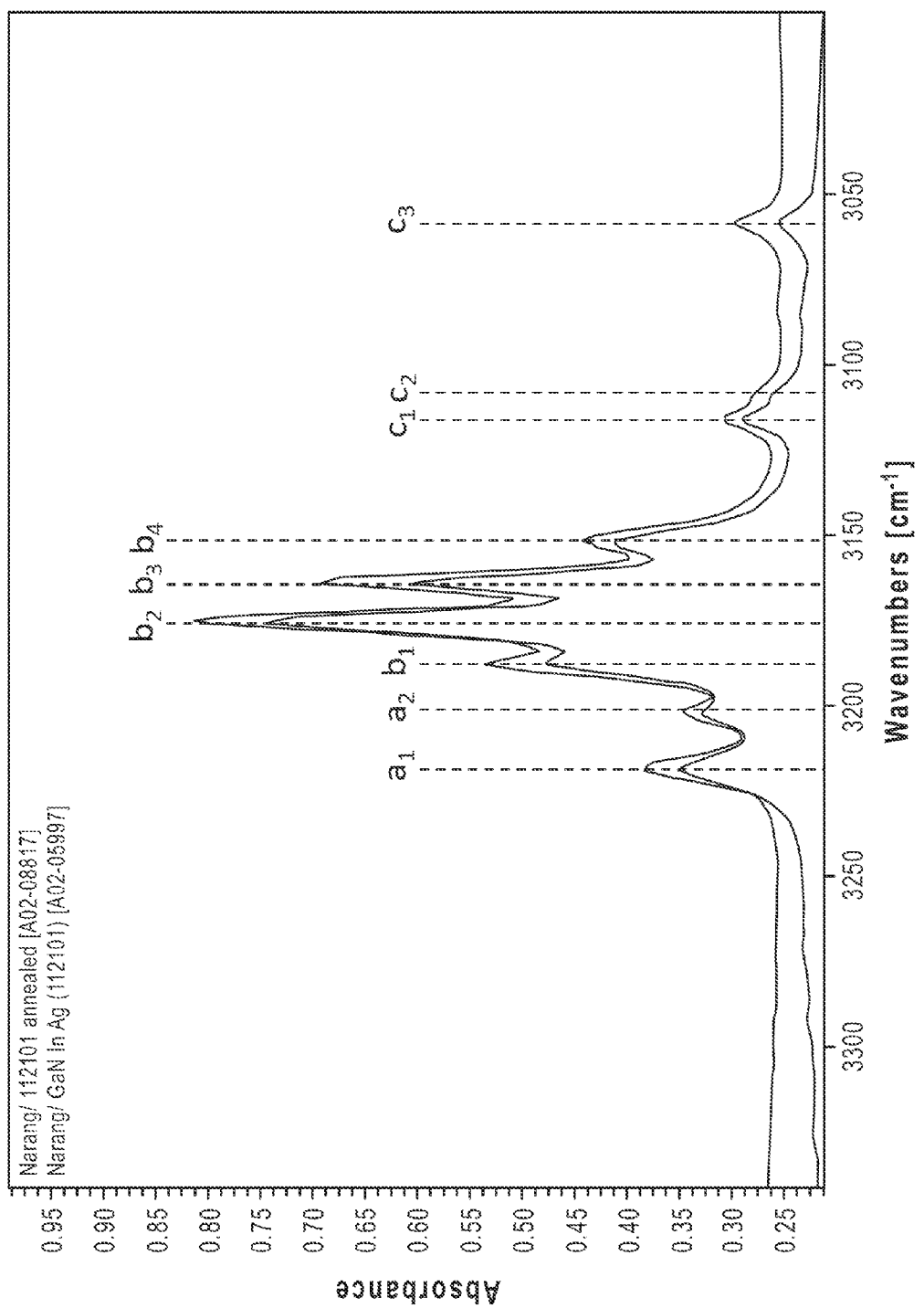
FIG. 1 shows infrared spectra of a gallium-containing nitride according to the prior art.

Approximating language, as used herein throughout the specification and claims may be applied to modify any quantitative representation that could permissibly vary without resulting in a change in the basic function to which it may be related. Accordingly, a value modified by a term such as "about" is not limited to the precise value specified. In at least one instance, the variance indicated by the term "about" may be determined with reference to the precision of the measuring instrumentation. Similarly, "free" may be combined with a term; and may include an insubstantial number, or a trace amount, while still being considered free of the modified term unless explicitly stated otherwise.

The metal of a metal nitride may include a group III metal. Suitable metals may include aluminum, gallium, and indium. The "one or more" refers to combinations of metals in the metal nitride, and may include compositions such as aluminum gallium nitride (AlGaN) and the like. As used herein, the term "gallium nitride" will be used as an illustrative example of a metal nitride, but it is understood that other group III metal nitrides are also possible.

A metal nitride composition may contain impurities. As used herein, the term "impurity" refers to a chemical species that is distinct from the group III metal nitride that constitutes the majority composition of the single-crystal or polycrystalline metal nitride. Several classes of impurities may be distinguished with respect to chemistry, atomic structure, intent, and effect. Impurities will generally comprise elements distinct from nitrogen, aluminum, gallium, and indium, including oxygen, carbon, halogens, hydrogen, alkali metals, alkaline earth metals, transition metals, and main block elements. The impurity may be present in a number of forms with different atomic structure. In some cases, the impurity is present as an isolated atom or ion within the crystalline lattice of the group III metal nitride, for example, as a substitutional or interstitial impurity. In other cases, the impurity is present in a distinct phase, for example, as an inclusion within an individual group III metal nitride grain or within a grain boundary of the group III metal nitride. The impurity may be deliberately added to enhance the properties of the group III metal nitride in some way, or may be unintentional. Finally, the impurity may or may not have a significant effect on the electrical, crystallographic, chemical, or mechanical properties of the group III metal nitride.

As used herein, and as is commonly used in the art, the term "dopant" refers to an impurity that is atomically dispersed within the group III metal nitride, for example, as a substitutional impurity, and which is typically added intentionally. With regard to dopants and dopant precursors (collectively "dopants" unless otherwise indicated), the electrical properties of the group III metal nitride composition may be controlled by adding one or more of such dopants to the above composition during processing. The dopant may also provide magnetic and/or luminescent properties to the group III metal nitride composition. Suitable dopants may include one or more of s or p block elements, transition metal elements, and rare earth elements. Suitable s and p block elements include, for example, silicon, germanium, magnesium, and tin. Other suitable dopants may include transition group elements. Suitable transition group elements include, for example, zinc, iron, or cobalt. Suitable dopants may produce an n-type material, a p-type material, or a semi-insulating material. In some embodiments, oxygen, whether added intentionally or unintentionally, also acts as a dopant.

Suitable dopant concentration levels in a single-crystal or polycrystalline composition may be greater than about $10^{10}$ atoms per cubic centimeter. In one embodiment, the dopant concentration may be in a range of from about $10^{10}$ atoms per cubic centimeter to about $10^{15}$ atoms per cubic centimeter, from about $10^{15}$ atoms per cubic centimeter to about $10^{16}$ atoms per cubic centimeter, from about $10^{16}$ atoms per cubic centimeter to about $10^{17}$ atoms per cubic centimeter, from about $10^{17}$ atoms per cubic centimeter to about $10^{18}$ atoms per cubic centimeter, from about $10^{18}$ atoms per cubic centimeter to about $10^{21}$ atoms per cubic centimeter, or greater than about $10^{21}$ atoms per cubic centimeter.

As used herein, the term "getter" refers to an impurity that is intentionally added and has a higher chemical affinity for an undesired impurity, for example, oxygen, than the principal metallic constituent of the composition, for example, gallium. The getter may become incorporated into the polycrystalline group III metal nitride in the form of an inclusion, for example, as a metal nitride, a metal halide, a metal oxide, a metal oxyhalide, or as a metal oxynitride. Examples of suitable getters include the alkaline earth metals, scandium, titanium, vanadium, chromium, yttrium, zirconium, niobium, the rare earth metals, hafnium, tantalum, and tungsten, and their nitrides and halides. In some embodiments, the getter impurity can act as both a getter and a dopant, such as magnesium. In other cases, the getter impurity atom has a larger atomic or covalent diameter than gallium and does not become incorporated as a dopant at sufficient levels to modify the electrical properties of the group III metal nitride significantly, and therefore functions predominantly or exclusively as a getter. The getter may be present in the polycrystalline group III metal nitride at a level greater than 100 ppm, from about 100 ppm to about 200 ppm, from about 200 ppm to about 500 ppm, from about 500 ppm to about 0.1%, from about 0.1% to about 0.2%, from about 0.2% to about 0.5%, from about 0.5% to about 2%, from about 2% to about 10%, or greater than 10%. Parts per million (ppm) and "%" refer to "by weight" unless otherwise indicated.

In other cases, impurities are unintended and/or undesirable inclusions in the polycrystalline group III metal nitride, and may result from, for example, processing and handling. Other unintentional impurities may result from contaminants in raw materials. Some unintentional impurities may be more closely associated with select raw materials. In some embodiments, the unintentional impurity includes oxygen present as a substitutional impurity, or dopant, in the polycrystalline group III metal nitride at higher than the desired level. In other embodiments, the unintentional impurity includes oxygen present as a group III oxide inclusion, for example, $Ga_2O_3$, $Al_2O_3$, and/or $In_2O_3$. The unintentional oxygen impurity may originate from residual oxygen in the metal raw material, from moisture or $O_2$ present as an impurity in the gaseous raw materials used in the synthesis process, from moisture generated from outgassing of the reactor components during the synthesis process, or from an air leak in the reactor. In one embodiment, the oxygen content present as $Ga_2O_3$ or as a substitutional impurity within gallium nitride may be less than about 300 parts per million (ppm). In another embodiment, the oxygen content present as $Ga_2O_3$ or as a substitutional impurity within gallium nitride may be in a range of from about 300 parts per million to about 100 parts per million, from about 100 parts per million to about 30 parts per million, from about 20 parts per million to about 10 parts per million, from about 10 parts per million to about 3 parts per million, from about 3 parts per million to about 1 part per million, from about 1 part per million to about 0.3 part per million, from about 0.3 part per million to about 0.1 part per million, or less than about 0.1 part per million.

D'Evelyn et al., in U.S. Pat. No. 7,078,731, taught the synthesis of GaN crystals with an optical absorption coefficient less than 5 $cm^{-1}$ between wavelengths of 465 nanometers and 700 nanometers. Precise values of the optical absorption coefficient were not reported but the same authors reported photographs of crystals having a pronounced yellowish tint (D'Evelyn et al., "Bulk GaN crystal growth by the high pressure ammonothermal method," *Journal of Crystal Growth* 300, 11 (2007)], implying significant optical absorption at blue-to-violet wavelengths. These authors also reported infrared spectra with a series of absorption features between 3000 and 3250 $cm^-$, whose intensities were reported to be insensitive to annealing. The most intense peak, at about 3175 $cm^{-1}$, had an absorbance, relative to the baseline, of about 0.6. Assuming a crystal thickness of about 400 microns, this corresponds to an absorbance per unit thickness of about 15 $cm^{-1}$. These infrared spectra are shown in FIG. 1, with newly-added peak designations, and provide a point of comparison to the unexpected findings of the present invention. Eight infrared peaks, with a designation and peak wavenumber as reported in Table 1, were extracted from FIG. 8 in U.S. Pat. No. 7,078,731. Quoting from the U.S. Pat. No. 7,078,731, with the exceptions of the insertions enclosed within brackets, "Based on predictions of vibrational frequencies of 3100-3470 $cm^{-1}$ for $V_{Ga}H_1$-$V_{Ga}H_4$ (which may overestimate the actual frequencies by about 200 $cm^{-1}$) and the observation of infrared absorption features at 3020-3050 $cm^{-1}$ and at 3140 $cm^{-1}$ in hydrogen-implanted GaN (Weinstein et al., Appl. Phys. Lett. 72, 1703 (1998)), we believe that the absorption peaks between 3150 and 3200 $cm^{-1}$ (i.e., peaks $a_2$ and $b_1$-$b_4$ in Table 1) in our samples correspond to $V_{Ga}H_3$ and $V_{Ga}H_4$, that the absorption peaks observed between 3000 and 3150 $cm^{-1}$ (i.e., peaks $c_1$-$c_3$) in both our crystal and hydrogen-implanted GaN correspond to $V_{Ga}H_1$ and $V_{Ga}H_2$, and that other minor peaks may be associated with the presence of other impurities or defects. Thus, the presence of an infrared absorption feature near 3175 $cm^{-1}$ in GaN crystals grown by the method described herein indicates passivation of gallium vacancies, and the persistence of the infrared feature upon high temperature annealing indicates that this passivation is quite stable."

TABLE 1

Designation and peak wavenumber values of peaks in infrared spectra of ammonothermally-grown bulk GaN crystals.

| Peak Designation | Peak Wavenumber ($cm^{-1}$) U.S. Pat. No. 7,078,731 | Peak Wavenumber ($cm^{-1}$) Present Invention |
|---|---|---|
| $a_1$ | 3218 | 3218 |
| $a_2$ | 3201 | 3202 |
| $b_1$ | 3187 | 3188 |
| $b_2$ | 3174 | 3175 |
| $b_3$ | 3163 | 3164 |
| $b_4$ | 3151 | 3150 |
| $c_1$ | 3115 | 3115 |
| $c_2$ | 3108 | 3108 |
| $c_3$ | 3058 | 3058 |
| $c_4$ | — | 3046 |
| $d_1$ | — | 3232 |

The D'Evelyn patent teaches four types of hydrogenated gallium-vacancy defects ($V_{Ga}H_1$, $V_{Ga}H_2$, $V_{Ga}H_3$ and $V_{Ga}H_4$) but does not have specific teaching about the relationship between the defect concentrations and transparency in visible wavelengths nor does it provide any indication of the relationship between crystallographic growth sector and transparency. Other references suggest that the presence of oxygen, in particular, is deleterious to transparency. Van de Walle taught that the energy levels of bare Ga vacancies and mono- and dehydrogenated Ga vacancies lie within the bandgap and therefore would be expected to give rise to sub-bandgap optical absorption, whereas the energy levels of tri- and tetra-hydrogenated Ga vacancies lay close to or within the valence band and therefore should have less or no impact on optical absorption. Van de Walle, "Interactions of hydrogen with native defects in GaN," *Phys. Rev. B* 56, R10020-R10023 (1997). However, to the best of our knowledge, more complicated Ga vacancy configurations have not been analyzed by high level quantum mechanical calculations.

In the absence of any defects or impurities, gallium nitride is quite transparent between wavelengths of 400 nanometers and 800 nanometers. Optical absorption within this range, therefore, can be attributed to defects, most likely, point defects. We have discovered several surprising features of the defect chemistry in ammonothermal GaN that have implications for the preparation of transparent ammonothermal GaN.

First, we find that the impurity concentrations of oxygen and fluorine, in particular, vary by more than an order of magnitude between different crystallographic growth sectors, with considerably lower concentrations being incorporated into the +c-plane (or Ga face) than in the −c-plane (N face) or into m-plane. As a consequence, the H/O ratios are very different.

Second, we find, surprisingly, that ammonothermal GaN grown in the −c-plane direction can be more transparent than ammonothermal GaN grown in the +c-plane direction despite having more than 10× higher oxygen concentration.

Third, we find, surprisingly, that the transparency of ammonothermal GaN grown in the +c-plane direction or in the m-direction can be improved markedly by annealing, but that the transparency of ammonothermal GaN grown in the −c-plane direction is typically relatively unaffected.

Fourth, we find, surprisingly, that there may be seven (7) or even more types of defects associated with partially-hydrogenated gallium vacancies in ammonothermal GaN that may play a critical role in transparency of ammonothermal GaN. Referring to Table 1, peaks $c_3$ and $c_4$ (the latter may be visible only when the former is relatively prominent) vary in intensity differently than the other peaks and seem clearly to be due to a distinct species. Similarly, peaks $c_1$ and $c_2$ vary in intensity differently than the other peaks and seem clearly to be due to a different, distinct species. The relative intensities of peaks $b_2$ and $b_3$ typically remain constant from sample to sample, and therefore these probably result from a single defect species. However, the relative intensity of peak $b_4$ to peaks $b_2$ and $b_3$ varies between different samples and therefore may be due to a different defect species. Peak $b_1$ sometimes appears together with peaks $b_2$-$b_4$ but sometimes appears without these peaks and therefore likely results from a distinct species. The relative intensities of peaks $a_1$ and $a_2$, when present, typically remain constant from sample to sample and therefore result from a single species, but these peaks are absent from some samples where one or more of peaks $b_1$-$b_4$ are present and so result from a separate defect. Newly discovered peak $d_1$ appears to represent still another defect. We have discovered that, at least in some cases, the relative intensities of these peaks may be manipulated in such a way so as to produce highly transparent ammonothermal GaN.

A high-quality n-type conductive, transparent, gallium nitride or metal nitride crystal or wafer may be manufactured cost-effectively by the following method.

One or more high-quality gallium nitride seed crystals or plates may be provided. The seed plates may have a minimum lateral dimension of at least one centimeter. In some embodiments, the seed plates have a maximum lateral dimension of at least two centimeters and a minimum lateral dimension of at least one centimeter. In other embodiments, the seed plates have minimum lateral dimensions of at least three centimeters, at least four centimeters, at least five centimeters, at least six centimeters, at least eight centimeters, or at least ten centimeters. In some embodiments, the seed plates are bulk single crystals of gallium nitride. In some embodiments the seed plates are prepared from crystals that were grown by hydride vapor phase epitaxy. In other embodiments, the seed plates are prepared from crystals that were grown ammonothermally. In still other embodiments, the seed plates are prepared from crystals that were grown from solution in a flux. In some embodiments, the dislocation density at the large- area surfaces of the seed plates is less than about $10^7$ cm$^{-2}$. In some embodiments, the dislocation density at the large-area surfaces of the seed plates is less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. In some embodiments, the full width at half maximum of the lowest-order x-ray diffraction line corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds.

In one specific embodiment, the orientation of the large-area surfaces of the seed plates is within about 5 degrees, within about 2 degrees, within about 1 degree, within about 0.5 degree, within about 0.2 degree, or within about 0.1 degree of a {1 0-1 0} m-plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a (0 0 0±1) c-plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a {1 1-2 0} a-plane. In some embodiments, the seed plate has a semi-polar large-surface orientation, which may be designated by (hkil) Bravais-Miller indices, where i=−(h+k), l is nonzero and at least one of h and k are non-zero. In a specific embodiment, the orientation of the large-area surfaces of the seed plates is within about 5 degrees, within about 2 degrees, within about 1 degree, within about 0.5 degree, within about 0.2 degree, or within about 0.1 degree of {1-1 0±1}, {1-1 0±2}, {1-1 0±3}, {2 0-2±1} or {1 1-2±2}.

The one or more seed plates may be affixed to a seed rack, as described in U.S. Application Publication No. 2010/0031875, which is incorporated by reference in its entirety. If the front and back faces of the seed plates are crystallographically non-equivalent, as with a c-plane or semi-polar orientation, two seed plates may be placed back to back so that the outward facing surfaces have an equivalent crystallographic orientation.

A polycrystalline group III metal nitride or gallium nitride nutrient material may be provided, as described in U.S. Pat. No. 8,461,071 and U.S. Application Publication No. 2011/0220912, each of which is incorporated by reference in its entirety. The polycrystalline group III metal nitride may have an oxygen content in the group III metal nitride material provided as a group III metal oxide or as a substitutional impurity within a group III metal nitride that is less than about 300 parts per million (ppm), less than about 100 ppm, or less than about 10 ppm. The polycrystalline group III metal nitride may comprise a getter at a level of at least 100 ppm with respect to the group III metal, where the getter is selected from at least alkaline earth metals, scandium, titanium, vanadium, chromium, yttrium, zirconium, niobium, rare earth metals, hafnium, tantalum, and tungsten. In certain embodiments, the polycrystalline group III metal nitride comprises at least one of silicon and germanium at a concentration between about $1\times10^{16}$ cm$^{-3}$ and about $1\times10^{19}$ cm$^{-3}$ or between about $1\times10^{17}$ cm$^{-3}$ and about $3\times10^{18}$ cm$^{-3}$.

The polycrystalline group III metal nitride may be placed in a basket, which is then placed in an autoclave or a capsule, as described in U.S. Pat. Nos. 6,656,615; 7,125,453; and 7,078,731 and in U.S. Application Publication No. 2009/0301388. Ammonia and a mineralizer, for example, at least one of an alkali metal, amide, nitride, or azide, an alkaline earth metal, amide, nitride, or azide, ammonium fluoride, ammonium chloride, a group III metal fluoride, a group III metal chloride, or a reaction product between a group III metal, ammonia, HF, and HCl are also placed in the autoclave or capsule.

In some embodiments a getter is also placed in the autoclave or capsule. The added getter may be provided in addition to a getter composition that may be present in the polycrystalline group III nitride. The added getter may comprise at least one of alkaline earth metals, Sc, Ti, V, Cr, Y, Zr, Nb, Hf, Ta, W, rare earth metals, and their nitrides, halides, oxynitrides, oxyhalides, amides, imides, and azides. In one specific embodiment, at least a portion of the getter is added in the form of a metal and at least a portion of the mineralizer is added as an azide in such a ratio that the hydrogen generated by reaction of the getter metal with ammonia and the nitrogen generated by decomposition of the azide are present in a ratio of approximately 3:1, as described in U.S. Pat. No. 8,323,405. The added getter may be useful for removing unintentional impurities, for example, oxygen, that are present in the mineralizer or other raw material. In one set of embodiments, the mineralizer comprises an alkali metal and the getter comprises a nitride, imide, or amide of Be, Mg, Ca, Sr, Ba, Sc. Y, a rare earth metal, Ti, Zr, Hf, V, Nb, Ta, Cr, Mo, or W. In another set of embodiments, the mineralizer comprises Cl and the getter comprises a nitride, chloride, oxynitride, or oxychloride of Sc, Cr, Zr, Nb, Hf, Ta, or W. In still another set of embodiments, the mineralizer comprises F and the getter comprises a nitride, fluoride, oxynitride, or oxyfluoride of Cr, Zr, Nb, Hf, Ta, or W.

After all the raw materials have been added to the autoclave or capsule, the autoclave or capsule is sealed.

The capsule, if employed, is then placed within a suitable high pressure apparatus. In one embodiment, the high pressure apparatus comprises an autoclave, as described by U.S. Pat. No. 7,335,262. In another embodiment, the high pressure apparatus is an internally heated high pressure apparatus, as described in U.S. Pat. No. 7,125,453, and in U.S. Application Publication No. 2006/0177362 A1 and U.S. Pat. No. 8,097,081. The polycrystalline group III metal nitride and seed crystals are then processed in supercritical ammonia at a temperature greater than about 400 degrees Celsius and a pressure greater than about 50 MegaPascal (MPa), during which at least a portion of the polycrystalline group III metal nitride is etched away and recrystallized onto at least one group III nitride crystal with a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 100 MPa, greater than about 200 MPa, greater than about 300 MPa, greater than about 400 MPa, greater than about 500 MPa, or greater than about 600 MPa.

Residual getter in the polycrystalline group III metal nitride is released into solution gradually as the polycrystalline group III metal nitride is etched. Once in solution, the getter may react to form a getter metal nitride, amide, or halide. The getter may also be chemically bound to oxygen. The getter may remove residual oxygen in the supercritical ammonia solution, enabling growth of group III nitride single crystals with improved purity and transparency.

By growing for a suitable period of time, the ammonothermally-grown crystalline group III metal nitride may have a thickness of greater than about 1 millimeter and a length, or diameter, greater than about 20 millimeters. In certain embodiments, the length is greater than about 50 millimeters or greater than about 100 millimeters. The crystalline group III nitride may be characterized by crystallographic radius of curvature of greater than 1 meter, greater than 10 meters, greater than 100 meters, greater than 1000 meter, or be greater than can be readily measured (infinite). After growth, the ammonothermally-grown crystalline group III metal nitride may be annealed in an inert, oxidizing, nitriding, or reducing atmosphere, for example, comprising one or more of argon, nitrogen, ammonia, oxygen, or hydrogen, at a pressure between about 1 millibar and 10,000 bar or between about 0.1 bar and about 1.1 bar. The annealing may be performed at a temperature between about 800 degree Celsius and about 1500 degree Celsius or between about 950 degrees Celsius and about 1200 degrees Celsius for a period of time in a range of from about 30 minutes to about 200 hours or from about 5 hours to about 50 hours. After growth, the ammonothermally-grown crystalline group III metal nitride may be sliced, lapped, polished, and chemical-mechanically polished according to methods that are known in the art to form one or more wafers or crystalline substrate members. In a specific embodiment, the root-mean-square surface roughness of the at least one wafer or crystalline substrate member is less than about one nanometer, for example, as measured by atomic force microscopy over an area of at least about 10 micrometers by 10 micrometers.

Figure 10:
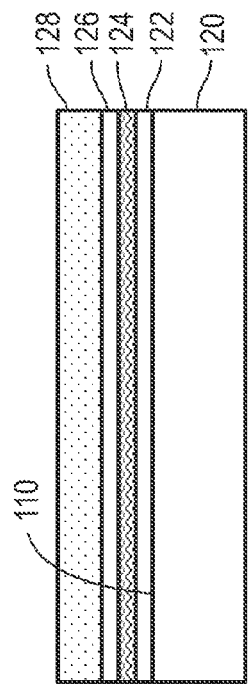
FIG. 10 shows crystal shapes and semiconductor devices fabricated on gallium-containing nitride crystals provided by the present disclosure according to certain embodiments.
Figure 10:
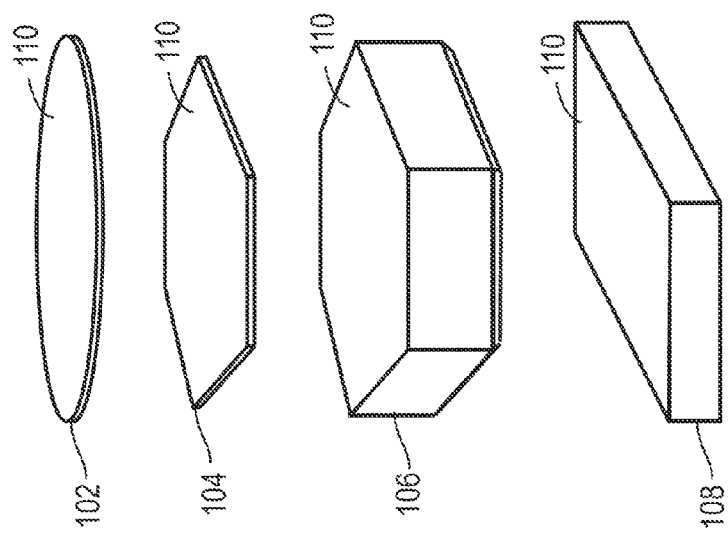

Referring to FIG. 10, in certain embodiments the ammonothermally-grown crystalline group III metal nitride takes the form of a wafer 102, a platelet crystal 104, a hexagonal boule 106, or a rectangular boule 108. Other shapes are also possible, for example, comprising one or more of as-grown (0001), (000-1), {10-10}, {10-1-1}, {10-1-2}, {10-11}, and {10-12} surfaces. In each case one surface of the ammonothermally-grown crystalline group III metal nitride may be designated as a top surface 110. In certain embodiments the top surface comprises one of at most two largest-area surfaces of a free-standing ammonothermally-grown group III metal nitride crystal. In certain embodiments, top surface 110 has growth features such as hillocks and/or etch features such as pits. In certain embodiments, for example, a wafer 102, the top surface 110 has been prepared for epitaxial regrowth, for example, by metalorganic chemical vapor deposition (MOCVD), molecular beam epitaxy, hydride vapor phase epitaxy (HVPE), ammonothermal growth, or flux growth. In certain embodiments, top surface 110 is prepared by chemical mechanical polishing and final cleaning in a clean-room environment.

The ammonothermally-grown crystalline group III metal nitride may be characterized by a wurzite structure substantially free from any cubic entities and have an optical absorption coefficient of about 2 cm$^{-1}$ and less at wavelengths between about 385 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than $10^{14}$ cm$^{-3}$, greater than $10^{15}$ cm$^{-3}$, or greater than $10^{16}$ cm$^{-3}$ of at least one of Li, Na, K, Rb, Cs, Mg, Ca, F, Cl, Br, and I and an optical absorption coefficient of about 2 cm$^{-1}$ and less at wavelengths between about 405 nanometers and about 750 nanometers. The ammonothermally-grown gallium nitride crystal may be semi-insulating, with a resistivity greater than $10^5$ Ω-cm, greater than $10^6$ Ω-cm, greater than $10^7$ Ω-cm, greater than $10^8$ Ω-cm, greater than $10^9$ Ω-cm, greater than $10^{10}$ Ω-cm, greater than $10^{11}$ Ω-cm, or greater than $10^{12}$ Ω-cm at room temperature. The ammonothermally-grown gallium nitride crystal may be an n-type semiconductor, with a carrier concentration n between about $10^{16}$ cm$^{-3}$ and $10^{20}$ cm$^{-3}$ and a carrier mobility η, in units of centimeters squared per volt-second, such that the logarithm to the base 10 of η is greater than about $-0.018557[\log_{10}(n)]^3 + 1.0671[\log_{10}(n)]^2 - 20.599[\log_{10}(n)] + 135.49$. In certain embodiments, the logarithm to the base 10 of η is greater than about $-0.018557[\log_{10}(n)]^3 + 1.0671[\log_{10}(n)]^2 - 20.599[\log_{10}(n)] + 135.59$. In certain embodiments, that the logarithm to the base 10 of η is greater than about $-0.018557[\log_{10}(n)]^3 + 1.0671[\log_{10}(n)]^2 - 20.599[\log_{10}(n)] + 135.69$. The ammonothermally-grown gallium nitride crystal may be a p-type semiconductor, with a carrier concentration n between about $10^{16}$ cm$^{-3}$ and $10^{20}$ cm$^{-3}$ and a carrier mobility η, in units of centimeters squared per volt-second, such that the logarithm to the base 10 of η is greater than about $-0.6546 \log_{10}(n) + 12.809$. The optical absorption coefficient of the ammonothermally-grown crystalline group III metal nitride at wavelengths between about 395 nm and about 460 nm may be less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$. The optical absorption coefficient of the ammonothermally-grown crystalline group III metal nitride at wavelengths of approximately 400 nm, 410 nm, 420 nm, and/or 450 nm may be less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$.

The transparent ammonothermally-grown crystalline group III metal nitride crystal, or a wafer sliced and polished from the crystal, may be used as a substrate for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for photoelectrochemical water splitting and hydrogen generation.

Referring again to FIG. 10, a transparent ammonothermally-grown crystalline group III metal nitride crystal may be used as a substrate 120 for growth by MOCVD. An n-type layer 122, comprising n-type $Al_xIn_yGa_{1-x-y}N$, where 0≤x, y≤1, is deposited overlying top surface 110 of substrate 120, thereby transforming top surface 110 from a free surface to a regrowth interface. Active layer 124, which may comprise an AlInGaN multiple quantum well structure, for example, is then deposited overlying n-type layer 122, and p-type layer 126, comprising p-type $Al_uIn_vGa_{1-x-y}N$, where 0≤u, v≤1, is deposited overlying active layer 124. An electrical contact 128, which may be reflective, may be deposited overlying p-type layer 126. Other layers are also possible.

EXAMPLES

Embodiments provided by the present disclosure are further illustrated by reference to the following examples, which describe crystals, properties of the crystals, and methods of fabricating the crystals provided by the present disclosure. It will be apparent to those skilled in the art that many modifications, both to materials, and methods, may be practiced without departing from the scope of the disclosure.

In the figures, #1 refers to the first free standing crystal, #2 refers to the second free-standing crystal, #3 refers to the third free-standing crystal, and #4 refers to the fourth free-standing crystal.

Comparative Example 1

A first previously-ammonothermally-grown m-plane substrate, approximately 111 micrometers thick was placed in a silver capsule along with a 13.4%-open-area baffle, polycrystalline GaN nutrient, NH$_4$F mineralizer, and ammonia, and the capsule was sealed. The ratios of GaN nutrient and NH$_4$F mineralizer to ammonia were approximately 1.85 and 0.091, respectively by weight. The capsule was placed in an internally-heated high pressure apparatus and heated to temperatures of approximately 655 degrees Celsius for the upper, nutrient zone and approximately 685 degrees Celsius for the lower, crystal growth zone, maintained at these temperatures for approximately 90 hours, and then cooled and removed. The first m-plane crystal grew to a thickness of approximately 685 micrometers.

Figure 2:
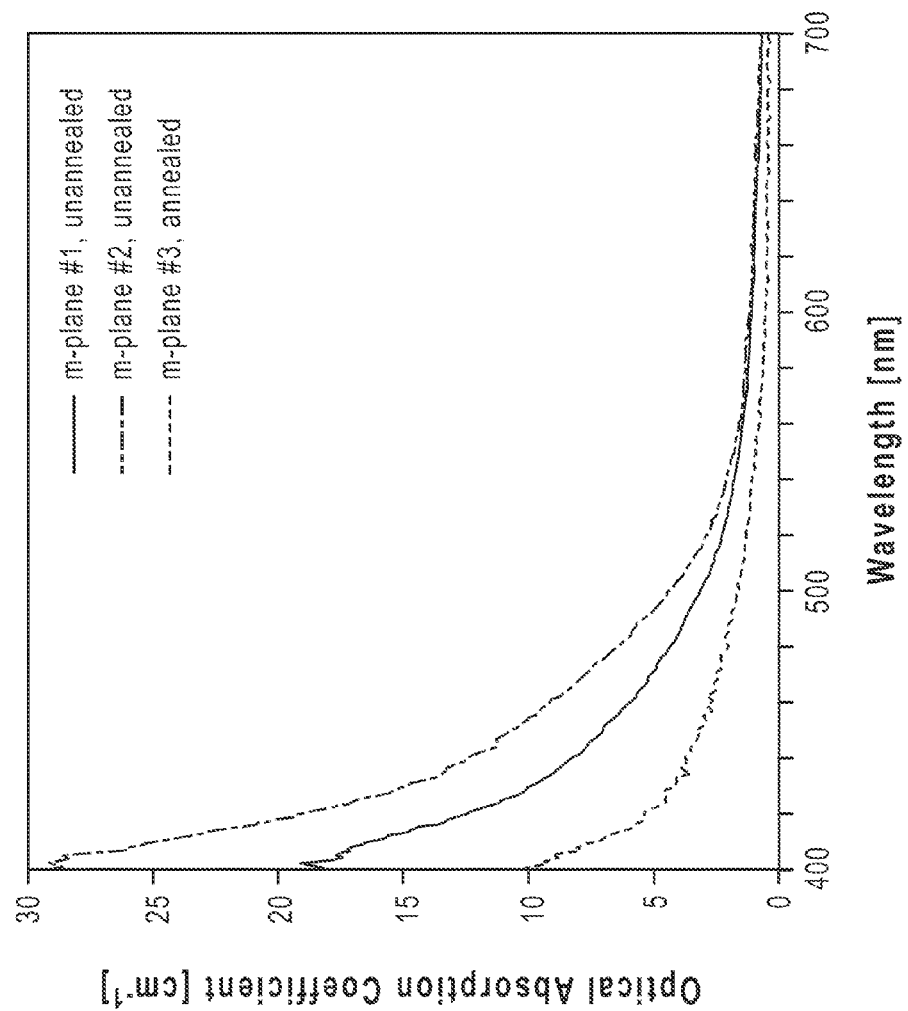
FIG. 2 shown optical absorption coefficients of a gallium-containing nitride crystal measured as a function of wavelength according to certain embodiments of the invention.

The front and back surface of the first m-plane ammonothermal crystal were polished and the optical absorption coefficient measured as a function of wavelength. The results are shown in FIG. 2. Although the crystal was transparent it had a strong yellow tint, with an optical absorption coefficient α of approximately 18 cm$^{-1}$ at a wavelength λ of 400 nm, approximately 16 cm$^{-1}$ at λ=410 nm, approximately 14 cm$^{-1}$ at λ=415 nm, and approximately 7 cm$^{-1}$ at λ=450 nm, with a wavelength derivative dα/dλ of approximately $-0.36$ cm$^{-1}$/nm at λ=410 nm. The infrared spectrum of the m-plane ammonothermal crystal was measured using a commercial Fourier Transform infrared spectrometer. Referring to Table 1, peaks $b_1$, $b_2$, $b_3$, $b_4$, $c_1$, $c_2$, and $c_3$ were present, similar to those in the prior-art crystal. However, peaks $a_1$ and $a_2$, which were quite prominent in the prior-art crystal, were not visible at all in the first m-plane ammonothermal crystal, proving that different species were responsible for peaks $a_1$ and $a_2$ than for peaks $b_1$, $b_2$, $b_3$, and $b_4$, contradicting the peak assignments in the prior-art reference. In addition, a new peak, $c_4$, was visible in the spectrum of the first m-plane ammonothermal crystal. The surface impurity composition of this crystal was measured by calibrated secondary ion mass spectrometry (SIMS) yielding levels of $4.2 \times 10^{19}$ cm$^{-3}$ for hydrogen, $1.6 \times 10^{19}$ cm$^{-3}$ for oxygen, and $8.6 \times 10^{18}$ cm$^{-3}$ for fluorine.

Example 1

Four (4) c-plane oriented bulk GaN crystal grown by HVPE, approximately 0.3 millimeters thick, were provided for use as substrates for patterning. On the first substrate, using nLOF2020 as a photoresist, a pattern comprising linear arrays of 50-micrometer-wide by 1-centimeter-long slits, with a pitch diameter of 550 micrometers was defined. On the second and third substrates, using nLOF2020 as a photoresist, a pattern comprising linear arrays of 20-micrometer-wide by 1-centimeter-long slits, with a pitch diameter of 1020 micrometers was defined. On the fourth substrate, using nLOF2020 as a photoresist, a pattern comprising linear arrays of 20-micrometer-wide by 1-centimeter-long slits, with a pitch diameter of 520 micrometers was defined. A 100-nanometer-thick layer of TiW was deposited on each substrate as an adhesion layer, followed by a 20-micrometer-thick inert layer comprising Au. A lift-off process was performed and the residual photoresist was removed to obtain two patterned c-plane substrates. The mask pattern on each substrate comprised domains of m-stripes, with linear openings oriented approximately parallel to <10-10>.

A first patterned c-plane substrate, together with a second previously-ammonothermally-grown m-plane substrate, approximately 116 micrometers thick, and a third previously-ammonothermally-grown m-plane substrate, approximately 70 micrometers thick, was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.27 and 0.092, respectively, by weight. The capsule was placed in an internally-heated high pressure apparatus and heated to temperatures of approximately 653 degrees Celsius for the upper, nutrient zone and approximately 690 degrees Celsius for the lower, crystal growth zone, maintained at these temperatures for approximately 140 hours, and then cooled and removed. Ammonothermal GaN grew through the linear openings in the patterned mask on the first c-plane HVPE GaN substrate, grew laterally, and coalesced fully, forming an ammonothermal GaN layer approximately 200 micrometers thick with a smooth top surface. The HVPE substrate was then removed from the first c-plane, patterned ammonothermal GaN layer, forming a first free-standing, c-plane, ammonothermal crystal approximately 167 micrometers thick. The second m-plane crystal grew to a thickness of approximately 717 micrometers and the third m-plane crystal grew to a thickness of approximately 801 micrometers.

Figure 3:
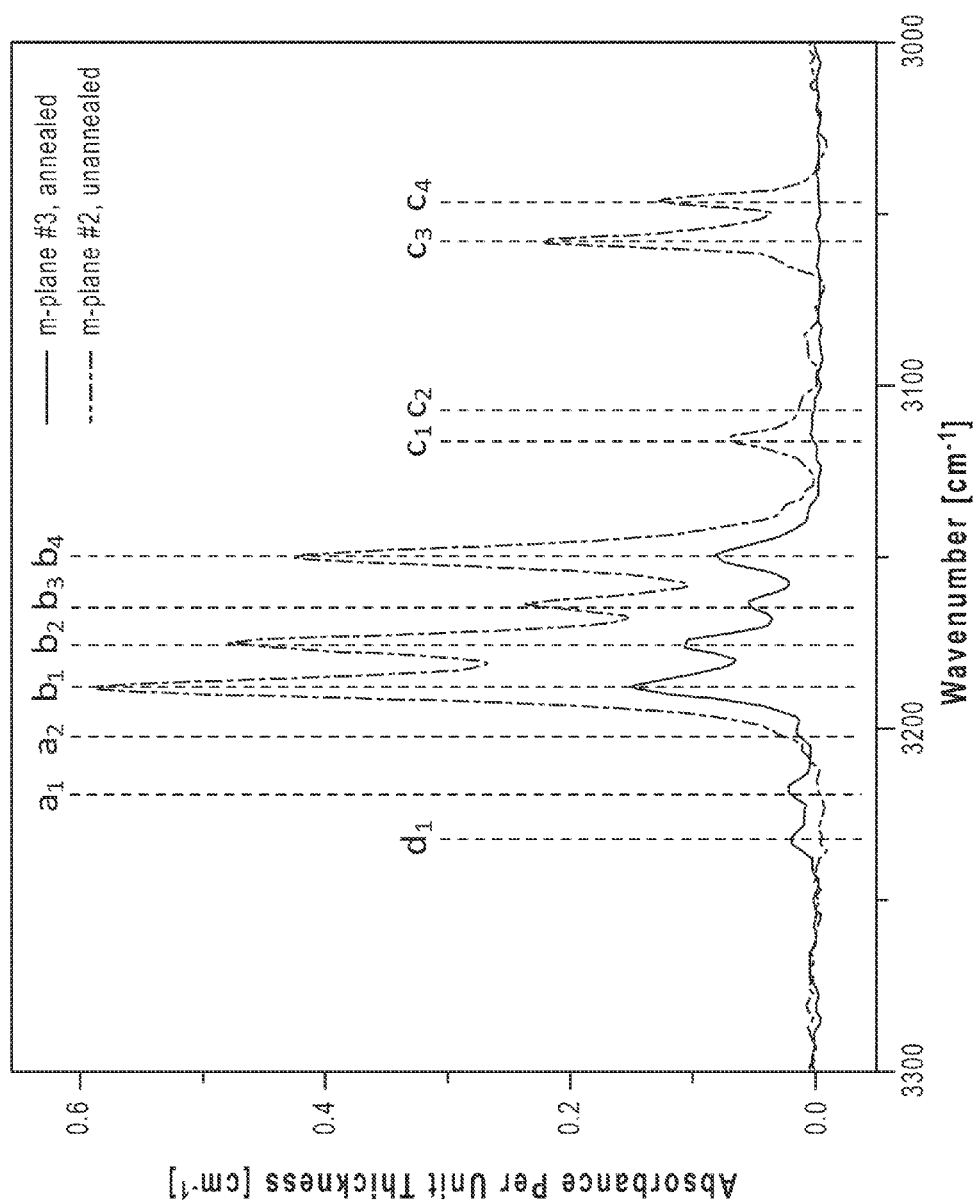
FIG. 3 shows infrared spectra of a gallium-containing nitride crystal according to certain embodiments of the invention.

The front and back surface of the second m-plane ammonothermal crystal were polished and the optical absorption coefficient measured as a function of wavelength. The results are shown in FIG. 2. Although the crystal was transparent it had a strong yellow tint, with an optical absorption coefficient $\alpha$ of approximately 29 cm$^{-1}$ at a wavelength $\lambda$ of 400 nm, approximately 25 cm$^{-1}$ at $\lambda$=410 nm, approximately 21.5 cm$^{-1}$ at $\lambda$=415 nm, and approximately 11 cm$^{-1}$ at $\lambda$=450 nm, with a wavelength derivative $d\alpha/d\lambda$ of approximately $-0.7$ cm$^{-1}$/nm at $\lambda$=410 nm. The infrared spectrum of the second m-plane ammonothermal crystal was measured using a commercial Fourier Transform infrared spectrometer. The results, which were very similar to those obtained with the first m-plane ammonothermal crystal, are shown in FIG. 3. By comparison to Table 1, it is evident that peaks $b_1$, $b_2$, $b_3$, $b_4$, $c_1$, $c_2$, and $c_3$ were present, similar to those in the prior-art crystal, with an absorbance per unit thickness of approximately 1.4 cm$^{-1}$. However, peaks $a_1$ and $a_2$, which were quite prominent in the prior-art crystal, were not visible at all in the m-plane ammonothermal crystal, proving that different species are responsible for peaks $a_1$ and $a_2$ than for peaks $b_1$, $b_2$, $b_3$, $b_4$, contradicting the peak assignments in the prior-art reference. In addition, a new peak, $c_4$, was visible in the spectrum of the second m-plane ammonothermal crystal.

The third m-plane crystal was placed in a furnace, heated to 1100 degrees Celsius in air, held at this temperature for 24 hours, and cooled. The front and back surfaces of the third, annealed m-plane ammonothermal crystal were polished and the optical absorption coefficient measured as a function of wavelength. The results are shown in FIG. 2. This crystal was transparent and almost colorless, with an optical absorption coefficient $\alpha$ of approximately 10 cm$^{-1}$ at a wavelength $\lambda$ of 400 nm, approximately 7 cm$^{-1}$ at $\lambda$=410 nm, approximately 6 cm$^{-1}$ at $\lambda$=415 nm, and approximately 3 cm$^{-1}$ at $\lambda$=450 nm, with a wavelength derivative $d\alpha/d\lambda$ of approximately $-0.3$ cm$^{-1}$/nm at $\lambda$=410 nm. The infrared spectrum of the m-plane ammonothermal crystal was measured using a commercial Fourier Transform infrared spectrometer and the results are shown in FIG. 3. Referring to Table 1, peaks $b_1$, $b_2$, $b_3$, $b_4$, were still present. However, peaks $a_1$ and $a_2$, which were not visible at all in the second, unannealed m-plane ammonothermal crystal, were now apparent. In addition, peaks $c_1$, $c_2$, $c_3$, and $c_4$, which were quite prominent in the second, unannealed m-plane crystal, were no longer visible, and a new peak, $d_1$, appeared at 3232 cm$^{-1}$. The ratios of the peak intensities of the $b_2$, $b_3$, and $b_4$ peaks to that of the $b_1$ peak were between 20% and 90%, or between 30% and 80%. The ratios of the $d_1$, $a_1$, and $a_2$ peaks to that of the $b_1$ peak are between 5% and 20%, and the $c_1$, $c_2$, $c_3$, and $c_4$, peaks were not visible, with a peak intensity less than 10% or less than 5% than that of the $b_1$ peak.

Example 2

The first free-standing, c-plane, ammonothermal crystal from Example 1 was used as a seed crystal for another crystal growth run. The crystal was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.72 and 0.092, respectively, by weight. The capsule was placed in an internally-heated high pressure apparatus and heated to temperatures of approximately 656 degrees Celsius for the upper, nutrient zone and approximately 687 degrees Celsius for the lower, crystal growth zone, maintained at these temperatures for approximately 140 hours, and then cooled and removed. Ammonothermal GaN grew on both the front and back face of the seed crystal, increasing its thickness to approximately 1.1 millimeter. This first free-standing ammonothermal crystal, together with the second patterned c-plane substrate from Example 1, was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.20 and 0.091, respectively, by weight. The capsule was placed in an internally-heated high pressure apparatus and heated to temperatures of approximately 650 degrees Celsius for the upper, nutrient zone and approximately 685 degrees Celsius for the lower, crystal growth zone, maintained at these temperatures for approximately 140 hours, and then cooled and removed. Ammonothermal GaN grew on both the front and back face of the first free-standing ammonothermal crystal, increasing its thickness to approximately 2.5 millimeters. Ammonothermal GaN grew through the linear openings in the patterned mask on the second c-plane HVPE GaN substrate, grew laterally, and coalesced fully, forming an ammonothermal GaN layer approximately 485 micrometers thick with a smooth top surface. The HVPE substrate was then removed from the second c-plane, patterned ammonothermal GaN layer, forming a second free-standing, c-plane, ammonothermal crystal approximately 485 micrometers thick.

The second free-standing, c-plane, ammonothermal crystal from was then used as a seed crystal for another crystal growth run. The crystal was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.47 and 0.092, respectively, by weight. The capsule was placed in an internally-heated high pressure apparatus and heated to temperatures of approximately 649 degrees Celsius for the upper, nutrient zone and approximately 684 degrees Celsius for the lower, crystal growth zone, maintained at these temperatures for approximately 120 hours, and then cooled and removed. Ammonothermal GaN grew on both the front and back face of the second free-standing, c-plane, ammonothermal crystal, increasing its thickness to approximately 1.2 millimeter.

Samples were then prepared from the first and second free-standing, c-plane ammonothermal crystals. The first free-standing, c-plane ammonothermal crystal was wire-sawed three-times, forming four slices, and the second free-standing, c-plane ammonothermal crystal was wire-sawed once, forming two slices. Portions of each of the slices were polished on both the front and back sides. Separated portions of the slices were placed in a furnace, heated to 1100 degrees Celsius in air, held at this temperature for 24 hours, and cooled. The front and back surfaces of the annealed slices were then polished.

Figure 4:
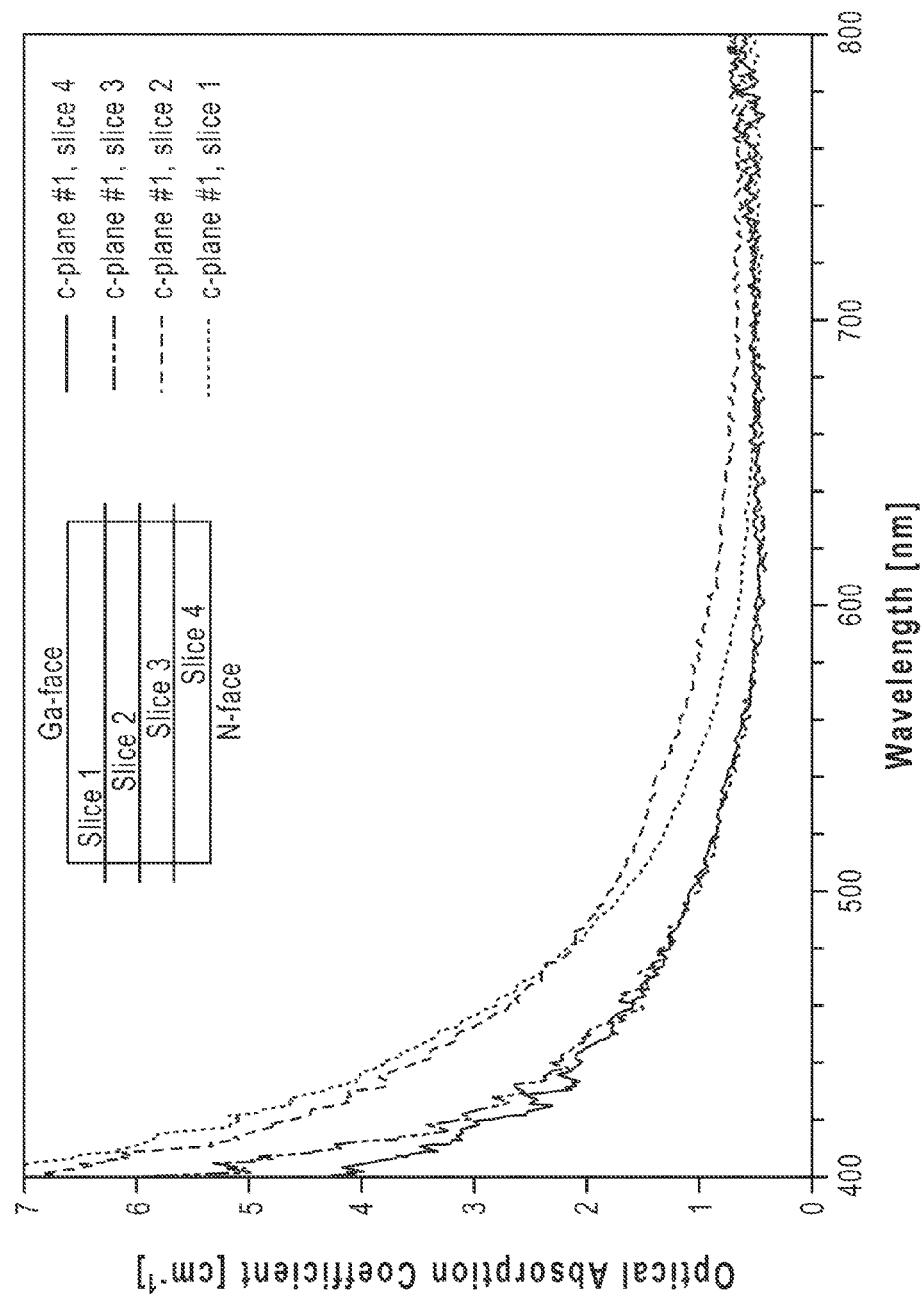
FIG. 4 shows optical absorption coefficients of the four slices from the first free-standing, c-plane ammonothermal gallium-containing nitride crystal, as a function of wavelength, according to certain embodiments of the invention.
Figure 5:
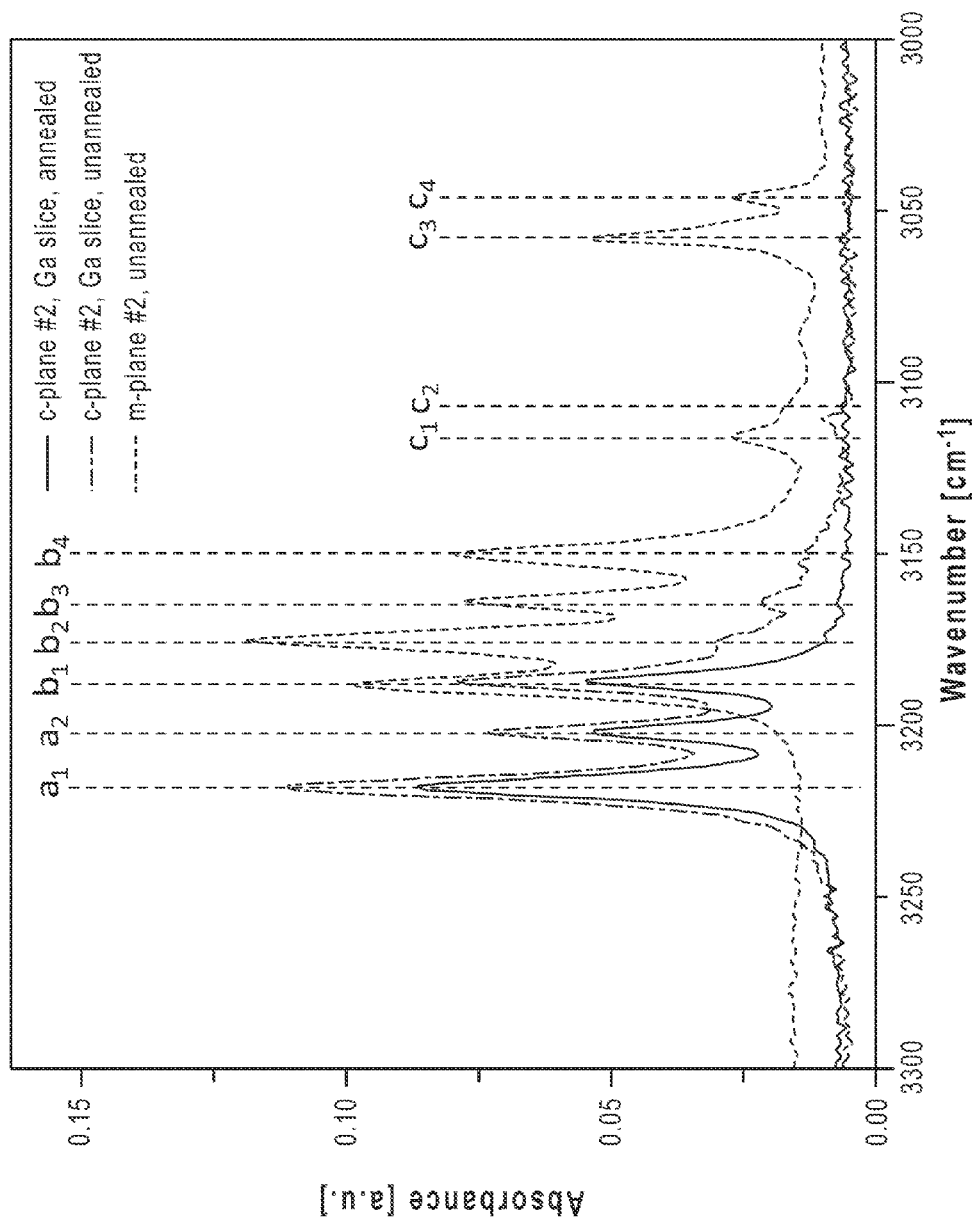
FIG. 5 shows measured results of infrared spectra of gallium-containing nitride crystals according to certain embodiments of the invention.
Figure 6:
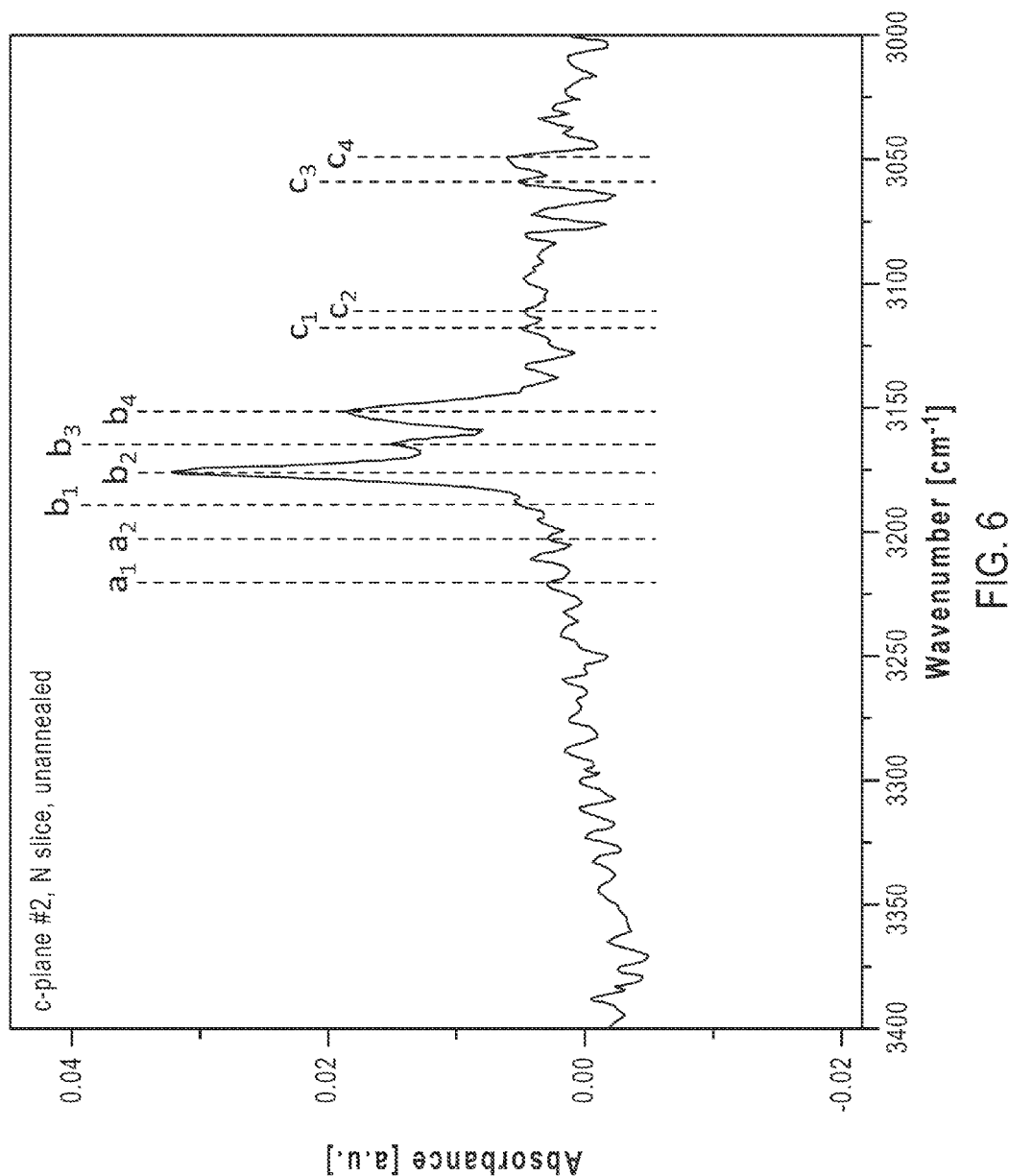
FIG. 6 shows measured results of infrared spectra of a gallium-containing nitride crystal according to certain embodiments of the invention.

The optical absorption coefficients of the unannealed four slices from the first free-standing, c-plane ammonothermal crystal are shown as a function of wavelength in FIG. 4. The two slices nearer the N-face, surprisingly, were significantly more transparent than the two slices nearer the Ga-face, with an optical absorption coefficient of about 4-6 $cm^{-1}$ at 400 nm (vs. about 7 $cm^{-1}$), an optical absorption coefficient of about 3.6-4.5 $cm^{-1}$ at 410 nm (vs. about 6 $cm^{-1}$), an optical absorption coefficient of about 3.25-3.6 $cm^{-1}$ at 415 nm (vs. about 5.7 $cm^{-1}$), and an optical absorption coefficient of about 1.8 $cm^{-1}$ at 450 nm (vs. about 3 $cm^{-1}$). The infrared spectra of the unannealed slice closest to the Ga-face of the second free-standing c-plane ammonothermal crystal and the unannealed slice closest to the N-face of the first free-standing c-plane ammonothermal crystal were measured and the results are shown in FIG. 5 and FIG. 6, respectively. The (unannealed) near-Ga-face slice exhibited absorption peaks at $a_1$ and $a_2$, by reference to FIG. 1 and Table 1, in addition to peaks at $b_1$-$b_4$ and $c_1$. However, the intensities of peaks $b_3$, $b_4$, and $c_1$ were considerably lower than those of the m-plane crystals. By contrast, surprisingly, the near-N-face slice exhibited absorption peaks $b_2$, $b_3$, and $b_4$, but not $a_1$, $a_2$, or $b_1$. Impurity concentrations in the unannealed near-Ga-face slice measured by SIMS included $3.4\times10^{18}$ $cm^{-3}$ hydrogen, $4.4\times10^{16}$ $cm^{-3}$ oxygen, and $2.4\times10^{15}$ $cm^{-3}$ fluorine. Impurity concentrations in the unannealed near-N-face slice measured by SIMS included $1.2\times10^{18}$ $cm^{-3}$ hydrogen, $2.3\times10^{18}$ $cm^{-3}$ oxygen, and $1.8\times10^{17}$ $cm^{-3}$ fluorine.

The electrical properties of the third slice from the first free-standing, c-plane ammonothermal crystal were measured before and after annealing using the van der Pauw Hall effect technique with a 0.51 Tesla magnet and a current of 15 mA DC. Before annealing, the carrier concentration was measured as $1.6\times10^{18}$ $cm^{-3}$ and the Hall mobility as 271 $cm^2$/V-s. After annealing, the carrier concentration was measured as $2.6\times10^{18}$ $cm^{-3}$ and the Hall mobility as 236 $cm^2$/V-s. The electrical properties of the annealed slice nearest the Ga-face from the second free-standing, c-plane ammonothermal crystal were measured by the same technique, yielding a carrier concentration of $7.1\times10^{16}$ $cm^{-3}$ and a Hall mobility of 623 $cm^2$/V-s. Before annealing, the second free-standing, c-plane ammonothermal crystal had a resistance that was too high to measure with the Hall technique, indicating semi-insulating behavior and a resistivity higher than about $10^8$ Ω-cm.

Figure 7:
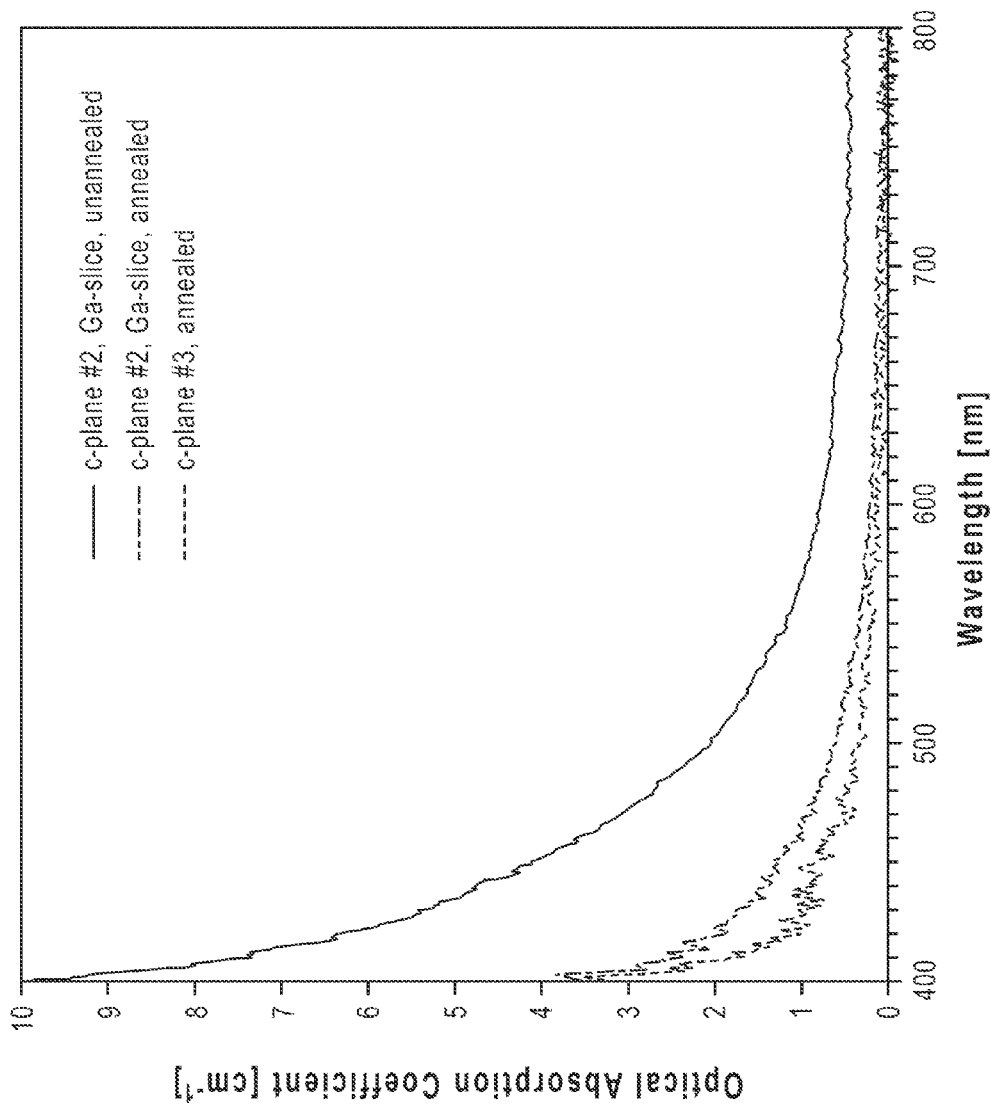
FIG. 7 depicts absorption coefficients of gallium-containing nitride crystals, measured as a function of wavelength, according to certain embodiments of the invention.

The optical absorption coefficients of the unannealed and annealed slice nearest the Ga-face from the second free-standing, c-plane ammonothermal crystal are shown as a function of wavelength in FIG. 7. Before annealing, this sample exhibited an optical absorption coefficient $\alpha$ of approximately 9.5 $cm^{-1}$ at a wavelength $\lambda$ of 400 nm, approximately 7.4 $cm^{-1}$ at $\lambda$=410 nm, approximately 7.0 $cm^{-1}$ at $\lambda$=415 nm, and approximately 4 $cm^{-1}$ at $\lambda$=450 nm, with a wavelength derivative $d\alpha/d\lambda$ of approximately −0.14 $cm^{-1}$/nm at $\lambda$=410 nm. After annealing, this sample exhibited an optical absorption coefficient $\alpha$ of approximately 3.7 $cm^{-1}$ at a wavelength $\lambda$ of 400 nm, approximately 2.4 $cm^{-1}$ at $\lambda$=410 nm, approximately 1.9 $cm^{-1}$ at $\lambda$=415 nm, and approximately 1.2 $cm^{-1}$ at $\lambda$=450 nm, with a wavelength derivative $d\alpha/d\lambda$ of approximately −0.04 $cm^{-1}$/nm at $\lambda$=410 nm. The infrared spectra of the unannealed and annealed slice nearest the Ga-face from the second free-standing, c-plane ammonothermal crystal were measured using a commercial Fourier Transform infrared spectrometer. The results are shown in FIG. 5. In the unannealed samples, peaks $b_1$, $b_2$, and $a_1$ were prominent, peaks $a_2$, $a_3$, and $c_1$ were barely detectible, and peaks $a_4$, $c_2$, $c_3$, and $c_4$ were absent. After annealing, only peaks $a_1$, $a_2$, and $b_1$ were visible, with no other peaks detectible, surprisingly. The ratios of the peak intensities of the $a_2$ and $b_1$ peaks to that of the $a_1$ peak were between 30% and 80%, or between 50% and 70%. The $b_2$, $b_3$, $b_4$, $c_1$, $c_2$, $c_3$, and $c_4$ peaks were not visible, with a peak intensity less than 10% or less than 5% than that of the $a_1$ peak. The absorbance per unit thickness of the most intense peak, $a_1$, was about 0.3 $cm^{-1}$ (sample thickness was approximately 300 micrometers). Before annealing, the impurity concentrations measured by SIMS included $4\times10^{18}$ $cm^{-3}$ hydrogen, $5.7\times10^{16}$ $cm^{-3}$ oxygen, and $1\times10^{16}$ $cm^{-3}$ fluorine. After annealing, the impurity concentrations measured by SIMS included $7.8\times10^{17}$ $cm^{-3}$ hydrogen, $3.8\times10^{16}$ $cm^{-3}$ oxygen, and $3.6\times10^{14}$ $cm^{-3}$ fluorine.

Example 3

The third patterned c-plane substrate from Example 1 was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.37 and 0.092, respectively, by weight. The capsule was placed in an internally-heated high pressure apparatus and heated to temperatures of approximately 653 degrees Celsius for the upper, nutrient zone and approximately 687 degrees Celsius for the lower, crystal growth zone, maintained at these temperatures for approximately 114 hours, and then cooled and removed. Ammonothermal GaN grew through the linear openings in the patterned mask on the third c-plane HVPE GaN substrate, grew laterally, and coalesced fully, forming an ammonothermal GaN layer approximately 420 micrometers thick with a smooth top surface. The HVPE substrate was then removed from the third c-plane, patterned ammonothermal GaN layer, forming a third free-standing, c-plane, ammonothermal crystal approximately 200 micrometers thick. The third free-standing, c-plane, ammonothermal crystal was placed in a furnace, heated to 1100 degrees Celsius in air, held at this temperature for 30 hours, and cooled.

The front and back surface of the third free-standing, c-plane, ammonothermal crystal were smoothed by etching in hot phosphoric acid and the optical absorption coefficient measured as a function of wavelength. The results are shown in FIG. 7. The crystal was transparent and virtually colorless, with an optical absorption coefficient a of approximately 2.4 cm$^{-1}$ at a wavelength $\lambda$ of 400 nm, approximately 1.5 cm$^{-1}$ at $\lambda$=410 nm, approximately 1.2 cm$^{-1}$ at $\lambda$=415 nm, and approximately 0.67 cm$^{-1}$ at $\lambda$=450 nm, with a wavelength derivative $d\alpha/d\lambda$ of approximately −0.06 cm$^{-1}$/nm at $\lambda$=410 nm.

Example 4

The fourth patterned c-plane substrate from Example 1 was placed in a silver capsule along with a 13.4%-open-area baffle, polycrystalline GaN nutrient, NH$_4$F mineralizer, and ammonia, and the capsule was sealed. Considerable cares was taken to eliminate sources of impurity contaminations from the polyGaN nutrient, the silver capsule, the mineralizer and the ammonia prior to sealing, including applying the teaching of U.S. patent application Ser. No. 14/033,107, which is incorporated by reference in its entirety. The ratios of GaN nutrient and NH$_4$F mineralizer to ammonia were approximately 1.60 and 0.090, respectively, by weight. The capsule was placed in an internally-heated high pressure apparatus and heated to temperatures of approximately 656 degrees Celsius for the upper, nutrient zone and approximately 680 degrees Celsius for the lower, crystal growth zone, maintained at these temperatures for approximately 164 hours, and then cooled and removed. Ammonothermal GaN grew through the linear openings in the patterned mask on the fourth c-plane HVPE GaN substrate, grew laterally, and coalesced fully, forming an ammonothermal GaN layer approximately 267 micrometers thick with a smooth top surface. The HVPE substrate was then removed from the fourth c-plane, patterned ammonothermal GaN layer, forming a fourth free-standing, c-plane, ammonothermal crystal approximately 250 micrometers thick.

The fourth free-standing, c-plane, ammonothermal crystal from was then used as a seed crystal for another crystal growth run. The Ga-side of the crystal was metalized with a 100-nanometer-thicker layer of TiW, followed by an 8-micrometer-thick inert layer comprising Au. The crystal was placed in a silver capsule along with a 13.4%-open-area baffle, polycrystalline GaN nutrient, NH$_4$F mineralizer, and ammonia, and the capsule was sealed. Considerable cares was taken to eliminate sources of impurity contaminations from the polyGaN nutrient, the silver capsule, the mineralizer and the ammonia prior to sealing. The ratios of GaN nutrient and NH$_4$F mineralizer to ammonia were approximately 2.85 and 0.090, respectively, by weight. The capsule was placed in an internally-heated high pressure apparatus and heated to temperatures of approximately 657 degrees Celsius for the upper, nutrient zone and approximately 680 degrees Celsius for the lower, crystal growth zone, maintained at these temperatures for approximately 281 hours, and then cooled and removed. Ammonothermal GaN grew only on the N-polar side of the fourth free-standing, c-plane, ammonothermal crystal, increasing its thickness to approximately 1.8 millimeters.

Figure 8:
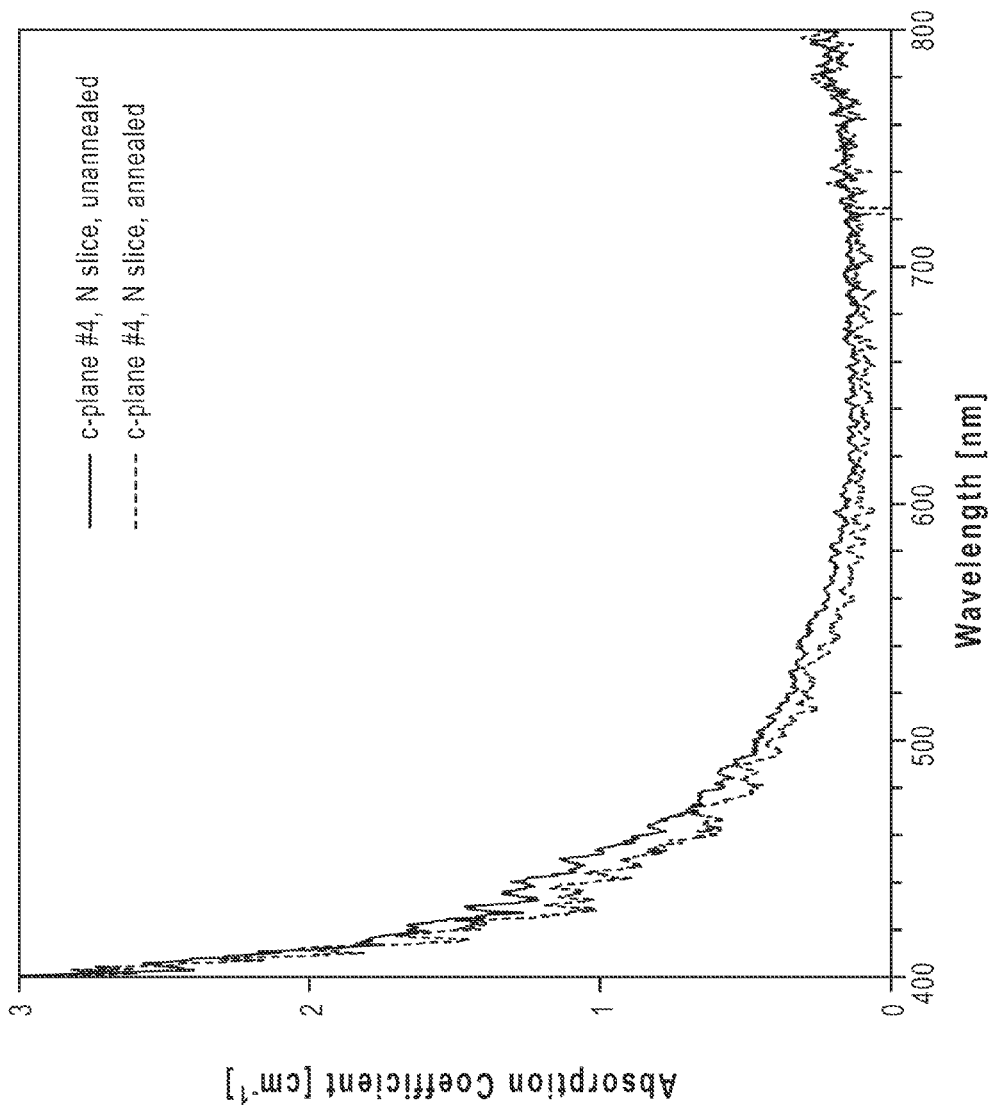
FIG. 8 shows optical absorption coefficients of two gallium-containing nitride crystals measured as a function of wavelength according to certain embodiments of the invention.

The fourth free-standing, c-plane, ammonothermal crystal was sliced to completely remove the seed crystal, leaving behind only the N-polar side grown material from the second re-growth. This material was then was double side lapped and polished to a final thickness of 420 micrometers. The N-face slice from the fourth free-standing, c-plane, ammonothermal crystal was transparent and virtually colorless, with an absorption coefficient of approximately 3.1 cm$^{-1}$ at $\lambda$=400 nm, approximately 2.1 cm$^{-1}$ at $\lambda$=410 nm, approximately 1.8 cm$^{-1}$ at $\lambda$=415 nm, and approximately 1.0 cm$^{-1}$ at $\lambda$=450 nm, with a wavelength derivative $d\alpha/d\lambda$ of approximately −0.07 cm$^{-1}$/nm at $\lambda$=410 nm, as shown in FIG. 8. After annealing at 1100° C. in air for 12 hours, this crystal exhibited very little change in optical absorption behavior, surprisingly. The annealed crystal had an absorption coefficient $\alpha$ of approximately 2.9 cm$^{-1}$ at a wavelength $\lambda$ of 400 nm, approximately 2.0 cm$^{-1}$ at $\lambda$=410 nm, approximately 1.7 cm$^{-1}$ at $\lambda$=415 nm, and approximately 0.8 cm$^{-1}$ at $\lambda$=450 nm, with a wavelength derivative $d\alpha/d\lambda$ of approximately −0.07 cm$^{-1}$/nm at $\lambda$=410 nm, as shown in FIG. 8.

The electrical properties of the N-face slice from the fourth free-standing, c-plane, ammonothermal crystal were measured after annealing using the van der Pauw Hall effect technique, yielding a carrier concentration of $1.1\times10^{18}$ cm$^{-3}$ and a Hall mobility of 300 cm$^2$/V-s.

Figure 9:
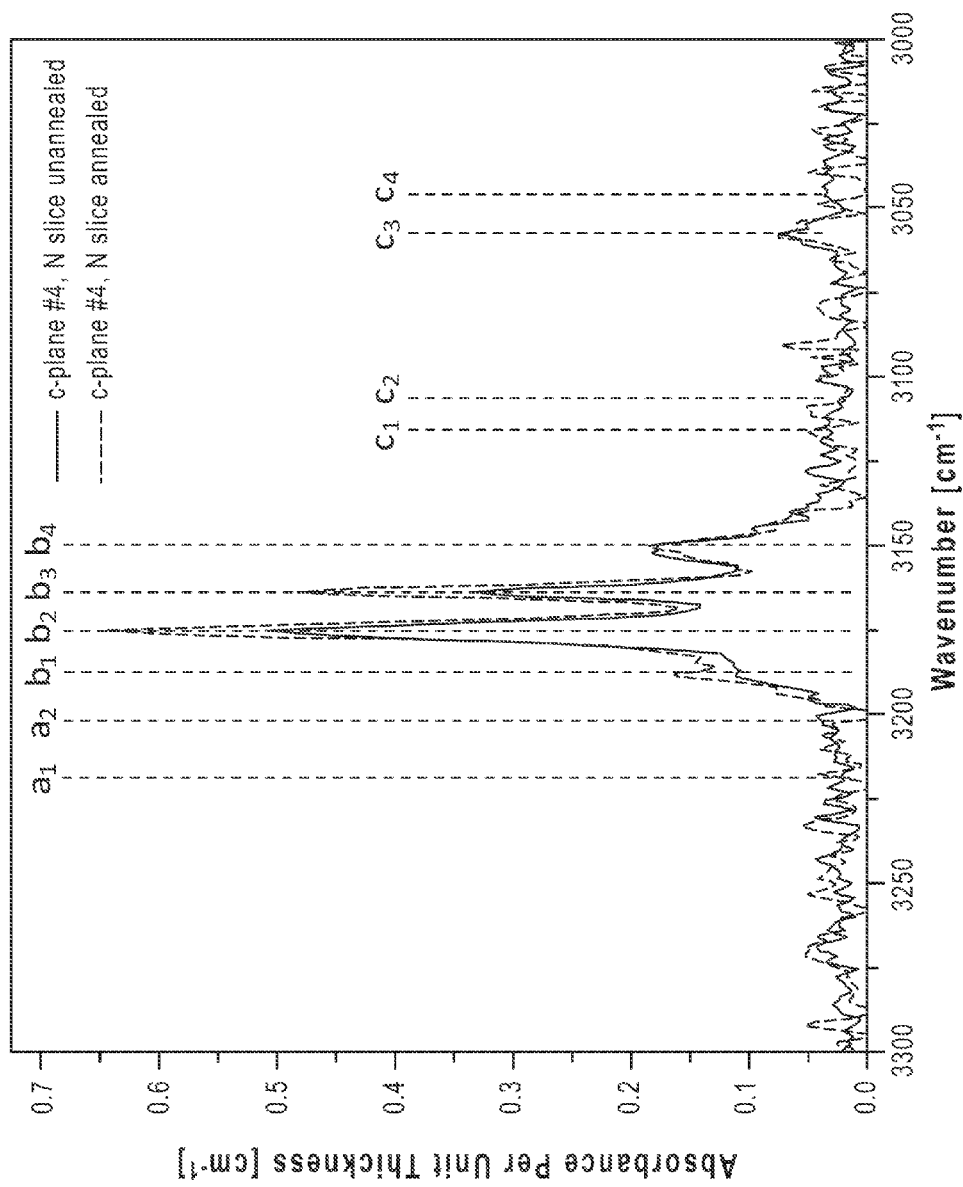
FIG. 9 shows measured results of infrared spectra of two gallium-containing nitride crystals according to certain embodiments of the invention.

The infrared spectra of the as-grown and annealed N-sector only material obtained from the N slice from the fourth c-plane ammonothermal crystal were measured using a commercial Fourier Transform infrared spectrometer. The results are shown in FIG. 9. Surprisingly, in both the as-grown and annealed samples only exhibited peaks $b_1$, $b_2$, $b_3$, and $b_4$, but not $a_1$ or $a_2$. Also surprising wass the lack of change in IR absorption spectra between as-grown and annealed crystals. The ratios of the peak intensities of the $b_3$ and $b_4$ peaks to that of the $b_2$ peak were between 10% and 90% or between 15% and 85%. Approximately similar peak intensity ratios were observed with the unannealed slice closest to the N-face of the first free-standing c-plane ammonothermal crystal (FIG. 6), although in this case the $b_4$ peak had a higher peak amplitude than the $b_3$ peak whereas the reverse was true with the N-face slice from the fourth free-standing c-plane ammonothermal crystal (FIG. 9). The $b_1$ and $c_3$ peaks were visible in the spectrum from the annealed, N-face slice from the fourth free-standing c-plane ammonothermal crystal (FIG. 9), with peak amplitudes between 5% and 25% of that of the $b_2$ peak, but it is not clear whether or not these peaks were present in the spectrum of the unannealed slice closest to the N-face of the first free-standing c-plane ammonothermal crystal (FIG. 6). The $a_1$, $a_2$, $c_1$, and $c_2$, peaks were not visible in either N-slice crystal, with a peak intensity less than 10% or less than 5% than that of the $b_2$ peak. The impurity concentrations of the fourth free-standing, c-plane, ammonothermal crystal measured by SIMS after annealing included $1.6\times10^{18}$ cm$^{-3}$ hydrogen, $1.9\times10^{18}$ cm$^{-3}$ oxygen, and $5.3\times10^{16}$ cm$^{-3}$ fluorine. These values were close to the results obtained from the as-grown N-face slice mentioned in example 2, providing further evidence for at most minor changes in defect concentrations during annealing of N-sector ammonothermal GaN material. Surprisingly, the N slice from the fourth free-standing, c-plane, ammonothermal crystal was significantly more transparent than as-grown Ga slice from the second and third free-standing, c-plane, ammonothermal crystals and almost as transparent as these Ga slices after annealing despite having an oxygen concentration higher by more than a factor of ten. In particular, the optical absorption coefficient was less than about 4 cm$^{-1}$ or less than about 3 cm$^{-1}$ at a wavelength of 400 nanometers, the optical absorption coefficient was less than about 3 cm$^{-1}$ or less than about 2.2 cm$^{-1}$ at a wavelength of 410 nanometers, the optical absorption coefficient was less than about 2.5 cm$^{-1}$ or less than about 2.0 cm$^{-1}$ at a wavelength of 415 nanometers, and the optical absorption coefficient was less than about 1.5 cm$^{-1}$ or less than about 1.0 cm$^{-1}$ at a wavelength of 450 nanometers.

While the above is a full description of the specific embodiments, various modifications, alternative constructions and equivalents may be used. Therefore, the above description and illustrations should not be taken as limiting the scope of the present invention, which is defined by the appended claims.

What is claimed is:

1. A gallium-containing nitride crystal comprising:
    a top surface having a crystallographic orientation within about 5 degrees of a plane selected from a (0001)+c-plane and a (000-1)–c-plane;
    a substantially wurtzite structure;
    n-type electronic properties;
    an impurity concentration greater than about $2\times10^{17}$ cm$^{-3}$ of hydrogen;
    an impurity concentration less than about $1\times10^{17}$ cm$^{-3}$ of oxygen;
    an H/O ratio of at least 10;
    an impurity concentration greater than about $2\times10^{14}$ cm$^{-3}$ of at least one of Li, Na, K, Rb, Cs, Ca, F, and Cl;
    an optical absorption coefficient less than about 5 cm$^{-1}$ at a wavelength of 400 nanometers;
    an optical absorption coefficient less than about 4 cm$^{-1}$ at a wavelength of 410 nanometers;
    an optical absorption coefficient less than about 3 cm$^{-1}$ at a wavelength of 415 nanometers; and
    an optical absorption coefficient less than about 2 cm$^{-1}$ at a wavelength of 450 nanometers;
    wherein the gallium-containing nitride crystal is characterized by,
        an absorbance per unit thickness of at least 0.01 cm$^{-1}$ at wavenumbers of 3218 cm$^{-1}$, 3202 cm$^{-1}$, and 3188 cm$^{-1}$; and
        no infrared absorption peaks at wavenumbers between about 3175 cm$^{-1}$ and about 3000 cm$^{-1}$ having an absorbance per unit thickness greater than 10% of the absorbance per unit thickness at 3218 cm$^{-1}$.

2. The gallium-containing nitride crystal of claim 1, characterized by a carrier concentration n between about $10^{16}$ cm$^{-3}$ and $10^{20}$ cm$^{-3}$ and a carrier mobility η, in units of centimeters squared per volt-second, such that the logarithm to the base 10 of η is greater than $-0.018557[\log_{10}(n)]^3 + 1.0671[\log_{10}(n)]^2 - 20.599[\log_{10}(n)] + 135.49$.

3. The gallium-containing nitride crystal of claim 1, further comprising an impurity concentration of at least one of silicon and germanium between about $1\times10^{17}$ cm$^{-3}$ and about $3\times10^{18}$ cm$^{-3}$.

4. The gallium-containing nitride crystal of claim 1, wherein the carrier concentration is between about $3\times10^{17}$ cm$^{-3}$ and about $3\times10^{18}$ cm$^{-3}$.

5. The gallium-containing nitride crystal of claim 1, wherein the top surface has a diameter greater than about 10 millimeters and the crystal has a thickness greater than about 100 micrometers.

6. The gallium-containing nitride crystal of claim 1, comprising an impurity concentration of at least one of F and Cl between about $2\times10^{14}$ cm$^{-3}$ and about $5\times10^{17}$ cm$^{-3}$.

7. A device comprising the gallium-containing nitride crystal of claim 1.

8. A gallium-containing nitride crystal comprising:
    a top surface having a crystallographic orientation within about 5 degrees of a plane selected from a (0001)+c-plane and a (000-1)–c-plane;
    a substantially wurtzite structure;
    n-type electronic properties;
    an impurity concentration greater than about $5\times10^{17}$ cm$^{-3}$ of hydrogen;
    an impurity concentration between about $2\times10^{17}$ cm$^{-3}$ and about $4\times10^{18}$ cm$^{-3}$ of oxygen;
    an H/O ratio of at least 0.3;
    an impurity concentration greater than about $1\times10^{16}$ cm$^{-3}$ of at least one of Li, Na, K, Rb, Cs, Ca, F, and Cl;
    an optical absorption coefficient less than about 8 cm$^{-1}$ at a wavelength of 400 nanometers;
    an optical absorption coefficient less than about 6 cm$^{-1}$ at a wavelength of 410 nanometers;
    an optical absorption coefficient less than about 5.5 cm$^{-1}$ at a wavelength of 415 nanometers;
    an optical absorption coefficient less than about 4 cm$^{-1}$ at a wavelength of 450 nanometers;
    an absorbance per unit thickness of at least 0.01 cm$^{-1}$ at wavenumbers of approximately 3175 cm$^{-1}$, 3164 cm$^{-1}$, and 3150 cm$^{-1}$;
    no infrared absorption peaks at wavenumbers between about 3200 cm$^{-1}$ and about 3400 cm$^{-1}$ or between about 3075 cm$^{-1}$ and about 3125 cm$^{-1}$ having an absorbance per unit thickness greater than 10% of the absorbance per unit thickness at 3175 cm$^{-1}$.

9. The gallium-containing nitride crystal of claim 8, characterized by a carrier concentration n between about $10^{16}$ cm$^{-3}$ and $10^{20}$ cm$^{-3}$ and a carrier mobility η, in units of centimeters squared per volt-second, such that the logarithm to the base 10 of η is greater than $-0.018557[\log_{10}(n)]^3 + 1.0671[\log_{10}(n)]^2 - 20.599[\log_{10}(n)] + 135.49$.

10. The gallium-containing nitride crystal of claim 8, further comprising an impurity concentration of at least one of silicon and germanium between about $1\times10^{17}$ cm$^{-3}$ and about $3\times10^{18}$ cm$^{-3}$.

11. The gallium-containing nitride crystal of claim 8, wherein the carrier concentration is between about $3\times10^{17}$ cm$^{-3}$ and about $3\times10^{18}$ cm$^{-3}$.

12. The gallium-containing nitride crystal of claim 8, wherein the top surface has a diameter greater than about 10 millimeters and the crystal has a thickness greater than about 100 micrometers.

13. The gallium-containing nitride crystal of claim 8, characterized by,
    an optical absorption coefficient less than about 4 cm$^{-1}$ at a wavelength of 400 nanometers;
    an optical absorption coefficient less than about 3 cm$^{-1}$ at a wavelength of 410 nanometers;
    an optical absorption coefficient less than about 2.5 cm$^{-1}$ at a wavelength of 415 nanometers; and
    an optical absorption coefficient less than about 1.5 cm$^{-1}$ at a wavelength of 450 nanometers.

14. The gallium-containing nitride crystal of claim 8, characterized by,
    an optical absorption coefficient less than about 3 cm$^{-1}$ at a wavelength of 400 nanometers;
    an optical absorption coefficient less than about 2.2 cm$^{-1}$ at a wavelength of 410 nanometers;
    an optical absorption coefficient less than about 2.0 cm$^{-1}$ at a wavelength of 415 nanometers; and an optical absorption coefficient less than about 1.0 cm$^{-1}$ at a wavelength of 450 nanometers.

15. A device comprising the gallium-containing nitride crystal of claim 8.

16. A gallium-containing nitride crystal comprising:
a top surface having a crystallographic orientation within about 5 degrees of a {1 0-1 0} m-plane;
a substantially wurtzite structure;
n-type electronic properties;
an impurity concentration greater than about 3×10$^{18}$ cm$^{-3}$ of hydrogen;
an impurity concentration between about 5×10$^{17}$ cm$^{-3}$ and about 3×10$^{19}$ cm$^{-3}$ of oxygen;
an H/O ratio of at least 1.1;
an impurity concentration greater than about 1×10$^{16}$ cm$^{-3}$ of at least one of Li, Na, K, Rb, Cs, Ca, F, and Cl;
an optical absorption coefficient less than about 8 cm$^{-1}$ at a wavelength of 400 nanometers;
an optical absorption coefficient less than about 6 cm$^{-1}$ at a wavelength of 410 nanometers;
an optical absorption coefficient less than about 5.5 cm$^{-1}$ at a wavelength of 415 nanometers;
an optical absorption coefficient less than about 4 cm$^{-1}$ at a wavelength of 450 nanometers;
an absorbance per unit thickness of at least 0.01 cm$^{-1}$ at 3188 cm$^{-1}$, 3175 cm$^{-1}$, 3164 cm$^{-1}$, and 3150 cm$^{-1}$; and
no infrared absorption peaks at wavenumbers between about 3125 cm$^{-1}$ and about 3000 cm$^{-1}$, having an absorbance per unit thickness greater than 10% of the absorbance per unit thickness at 3188 cm$^{-1}$.

17. The gallium-containing nitride crystal of claim 16, characterized by a carrier concentration n between about 10$^{16}$ cm$^{-3}$ and 10$^{20}$ cm$^{-3}$ and a carrier mobility η, in units of centimeters squared per volt-second, such that the logarithm to the base 10 of η is greater than −0.018557[log$_{10}$(n)]$^3$+ 1.0671[log$_{10}$(n)]$^2$−20.599[log$_{10}$(n)]+135.49.

18. The gallium-containing nitride crystal of claim 16, wherein the absorbance per unit thickness at 3232 cm$^{-1}$ is at least 0.01 cm$^{-1}$.

19. The gallium-containing nitride crystal of claim 16, further comprising an impurity concentration of at least one of silicon and germanium between about 1×10$^{17}$ cm$^{-3}$ and about 3×10$^{18}$ cm$^{-3}$.

20. The gallium-containing nitride crystal of claim 16, wherein the carrier concentration is between about 3×10$^{17}$ cm$^{-3}$ and about 3×10$^{18}$ cm$^{-3}$.

21. The gallium-containing nitride crystal of claim 16, wherein the top surface has a diameter greater than about 10 millimeters and the crystal has a thickness greater than about 100 micrometers.

22. A device comprising the gallium-containing nitride crystal of claim 16.

* * * * *